(12) United States Patent
Kledzik et al.

(10) Patent No.: US 7,102,892 B2
(45) Date of Patent: Sep. 5, 2006

(54) MODULAR INTEGRATED CIRCUIT CHIP CARRIER

(75) Inventors: Kenneth J. Kledzik, San Clemente, CA (US); Jason C. Engle, San Clemente, CA (US)

(73) Assignee: Legacy Electronics, Inc., San Clemente, CA (US)

( * ) Notice: Subject to any disclaimer, the term of this patent is extended or adjusted under 35 U.S.C. 154(b) by 332 days.

(21) Appl. No.: 10/371,061

(22) Filed: Feb. 21, 2003

(65) Prior Publication Data

US 2003/0165051 A1    Sep. 4, 2003

Related U.S. Application Data

(63) Continuation-in-part of application No. 09/688,499, filed on Oct. 16, 2000, now Pat. No. 6,545,868, which is a continuation-in-part of application No. 09/524,324, filed on Mar. 13, 2000, now Pat. No. 6,487,078.

(60) Provisional application No. 60/360,473, filed on Feb. 26, 2002.

(51) Int. Cl.
    *H05K 1/14* (2006.01)
(52) U.S. Cl. .............. 361/770; 361/782; 361/803; 361/804; 257/686; 257/724; 438/109
(58) Field of Classification Search ......... 361/767, 361/770, 782, 790, 803, 804; 257/686, 723, 257/724; 438/109
    See application file for complete search history.

(56) References Cited

U.S. PATENT DOCUMENTS

| 3,239,719 A | 3/1966 | Shower |
| 3,665,256 A | 5/1972 | Goun et al. |
| 3,737,986 A | 6/1973 | Cranston |
| 3,777,221 A | 12/1973 | Tatusko et al. |
| 4,038,488 A | 7/1977 | Lin |
| 4,245,877 A | 1/1981 | Auriana |
| 4,288,841 A | 9/1981 | Gogal |
| 4,322,778 A | 3/1982 | Barbour et al. |
| 4,398,235 A | 8/1983 | Lutz et al. |
| 4,437,235 A | 3/1984 | McIver |
| 4,549,200 A | 10/1985 | Ecker et al. |
| 4,616,655 A | 10/1986 | Weinberg et al. |
| 4,632,293 A | 12/1986 | Feinstein |
| 4,763,188 A | 8/1988 | Johnson |
| 4,802,062 A | 1/1989 | Blum et al. |
| 4,982,265 A | 1/1991 | Watanabe et al. |

(Continued)

FOREIGN PATENT DOCUMENTS

DE    198 45 316 A1    2/1999

(Continued)

OTHER PUBLICATIONS

PCT Notification of Transmittal of International Search Report or Declaration.

(Continued)

*Primary Examiner*—John B. Vigushin
(74) *Attorney, Agent, or Firm*—Schwartz Sung & Webster

(57) ABSTRACT

An apparatus and method is disclosed that allows for the arranging in a three dimensional array semiconductor chips on a circuit board. A unique chip carrier is disclosed on which any IC chip can be positioned on above the other on a circuit board. Additionally, the carrier allows for the testing of IC chips on the carrier and underneath it without having to remove the carrier and chips from the system even if they are of the BGA or CSP type. The carrier includes exposed test points to allow an on site test.

90 Claims, 16 Drawing Sheets

U.S. PATENT DOCUMENTS

| | | | |
|---|---|---|---|
| 4,998,886 A * | 3/1991 | Werner | 439/66 |
| 5,061,990 A | 10/1991 | Arakawa et al. | |
| 5,107,586 A | 4/1992 | Eichelberger et al. | |
| 5,128,831 A | 7/1992 | Fox, III et al. | |
| 5,130,894 A * | 7/1992 | Miller | 361/735 |
| 5,191,404 A | 3/1993 | Wu et al. | |
| 5,191,405 A * | 3/1993 | Tomita et al. | 257/777 |
| 5,239,198 A | 8/1993 | Lin et al. | |
| 5,239,447 A | 8/1993 | Cotues et al. | |
| 5,241,456 A * | 8/1993 | Marcinkiewicz et al. | 361/792 |
| 5,259,767 A * | 11/1993 | Kurbikoff et al. | 439/59 |
| 5,262,594 A * | 11/1993 | Edwin et al. | 174/254 |
| 5,285,352 A * | 2/1994 | Pastore et al. | 361/707 |
| 5,299,094 A | 3/1994 | Nishino et al. | |
| 5,311,401 A | 5/1994 | Gates, Jr. et al. | |
| 5,311,407 A | 5/1994 | Lumbard | |
| 5,313,366 A | 5/1994 | Gaudenzi et al. | |
| 5,316,787 A | 5/1994 | Imken et al. | |
| 5,377,077 A | 12/1994 | Burns | |
| 5,394,300 A | 2/1995 | Yoshimura | |
| 5,400,904 A | 3/1995 | Maston, III et al. | |
| 5,412,538 A | 5/1995 | Kikinis et al. | |
| 5,418,688 A | 5/1995 | Hertz et al. | |
| 5,450,283 A | 9/1995 | Lin et al. | |
| 5,479,318 A | 12/1995 | Burns | |
| 5,492,223 A | 2/1996 | Boardman et al. | |
| 5,498,906 A | 3/1996 | Roane et al. | |
| 5,507,403 A * | 4/1996 | Sakemura et al. | 216/18 |
| 5,514,907 A | 5/1996 | Moshayedi | |
| 5,570,274 A * | 10/1996 | Saito et al. | 361/784 |
| 5,579,207 A * | 11/1996 | Hayden et al. | 361/790 |
| 5,656,856 A | 8/1997 | Kweon | |
| 5,677,569 A | 10/1997 | Choi et al. | |
| 5,701,233 A * | 12/1997 | Carson et al. | 361/735 |
| 5,739,581 A * | 4/1998 | Chillara et al. | 257/668 |
| 5,742,097 A | 4/1998 | Matsunaga et al. | |
| 5,744,827 A | 4/1998 | Jeong et al. | |
| 5,744,862 A | 4/1998 | Ishii | |
| 5,754,408 A | 5/1998 | Derouiche | |
| 5,757,079 A | 5/1998 | McAllister et al. | |
| 5,783,870 A | 7/1998 | Mostafazadeh et al. | |
| 5,798,014 A * | 8/1998 | Weber | 156/263 |
| 5,810,609 A | 9/1998 | Faraci et al. | |
| 5,869,353 A | 2/1999 | Levy et al. | |
| 5,869,356 A * | 2/1999 | Fuller et al. | 438/126 |
| 5,910,885 A | 6/1999 | Gulachenski et al. | |
| 5,982,633 A | 11/1999 | Jeansonne | |
| 6,014,316 A | 1/2000 | Eide | |
| 6,028,352 A | 2/2000 | Eide | |
| 6,038,132 A | 3/2000 | Tokunaga et al. | |
| 6,049,972 A | 4/2000 | Link et al. | |
| 6,072,122 A * | 6/2000 | Hosoya | 174/52.4 |
| 6,081,429 A * | 6/2000 | Barrett | 361/767 |
| 6,084,293 A | 7/2000 | Ohuchi | |
| 6,084,780 A | 7/2000 | Happoya | |
| 6,093,249 A | 7/2000 | Curtin | |
| 6,101,100 A * | 8/2000 | Londa | 361/761 |
| 6,107,683 A * | 8/2000 | Castro et al. | 257/700 |
| RE36,916 E | 10/2000 | Moshayedi | |
| 6,160,718 A | 12/2000 | Vakilian | |
| 6,214,640 B1 | 4/2001 | Fosberry et al. | |
| 6,222,739 B1 | 4/2001 | Bhakta et al. | |
| 6,262,488 B1 | 7/2001 | Masayuki et al. | |
| 6,291,259 B1 | 9/2001 | Chun | |
| 6,313,522 B1 * | 11/2001 | Akram et al. | 257/686 |
| 6,313,524 B1 | 11/2001 | Pueschner et al. | |
| 6,320,757 B1 * | 11/2001 | Liu | 361/760 |
| 6,388,335 B1 | 5/2002 | Lam | |
| 6,404,043 B1 * | 6/2002 | Isaak | 257/686 |
| 6,428,650 B1 | 8/2002 | Chung | |
| 6,445,591 B1 * | 9/2002 | Kwong | 361/761 |
| 6,462,284 B1 | 10/2002 | Hashimoto | |
| 6,469,376 B1 * | 10/2002 | Vaiyapuri | 257/686 |
| 6,472,735 B1 * | 10/2002 | Isaak | 257/686 |
| 6,515,237 B1 * | 2/2003 | Kikuchi et al. | 174/261 |
| 6,559,539 B1 * | 5/2003 | Tu et al. | 257/723 |
| 6,566,746 B1 * | 5/2003 | Isaak et al. | 257/685 |
| 6,566,760 B1 | 5/2003 | Kawamura et al. | |
| 6,614,110 B1 | 9/2003 | Pace | |
| 6,618,267 B1 * | 9/2003 | Dalal et al. | 361/767 |
| 6,627,984 B1 | 9/2003 | Bruce et al. | |
| 6,628,527 B1 * | 9/2003 | Muramatsu et al. | 361/768 |
| 6,665,194 B1 * | 12/2003 | Patel et al. | 361/767 |
| 6,683,377 B1 | 1/2004 | Shim et al. | |
| 6,777,798 B1 * | 8/2004 | Fukumoto et al. | 257/686 |
| 6,787,916 B1 * | 9/2004 | Halahan | 257/777 |
| 6,828,666 B1 | 12/2004 | Herrell et al. | |
| 6,924,556 B1 | 8/2005 | Cha | |
| 6,991,964 B1 * | 1/2006 | Matsuo et al. | 438/109 |
| 2002/0088355 A1 | 7/2002 | Comulada | |
| 2003/0122240 A1 | 7/2003 | Lin et al. | |
| 2003/0137808 A1 | 7/2003 | Kledzik et al. | |
| 2003/0168725 A1 | 9/2003 | Warner | |
| 2003/0201526 A1 | 10/2003 | Bolken et al. | |
| 2004/0094751 A1 * | 5/2004 | Ogiwara | 252/500 |

FOREIGN PATENT DOCUMENTS

| | | |
|---|---|---|
| DE | 100 29 259 | 12/2001 |
| EP | 0 714 231 A2 | 5/1996 |
| JP | 08-051183 | 2/1996 |
| JP | 09-245926 | 9/1997 |
| JP | 10-074769 | 3/1998 |
| JP | 11-111914 | 4/1999 |
| JP | 2000-031617 | 2/2000 |
| JP | 2003-521806 | 7/2003 |
| WO | WO 00/35016 | 6/2000 |
| WO | WO 00/65652 | 11/2000 |
| WO | WO 00 68996 | 11/2000 |
| WO | WO 01 48819 | 7/2001 |
| WO | WO 01 69680 | 9/2001 |

OTHER PUBLICATIONS

PCT International Search Report.
30(8) IBM Tech. Discl. Bull. 373-4 (1988).

* cited by examiner

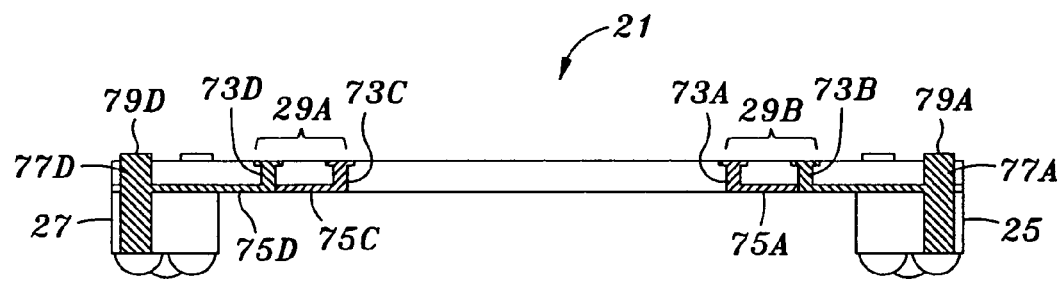
FIG. 4
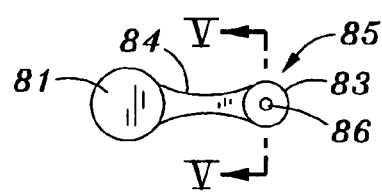
FIG. 5A
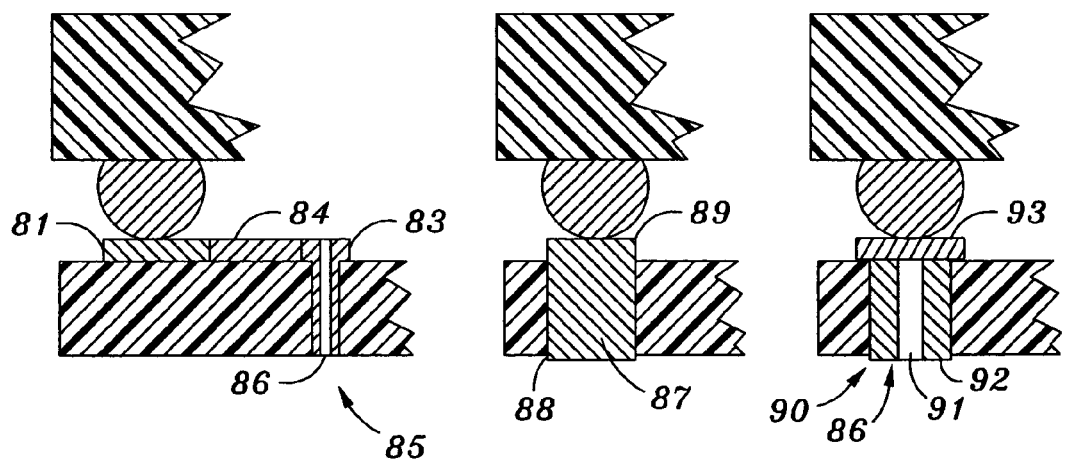
FIG. 5B  FIG. 5C  FIG. 5D

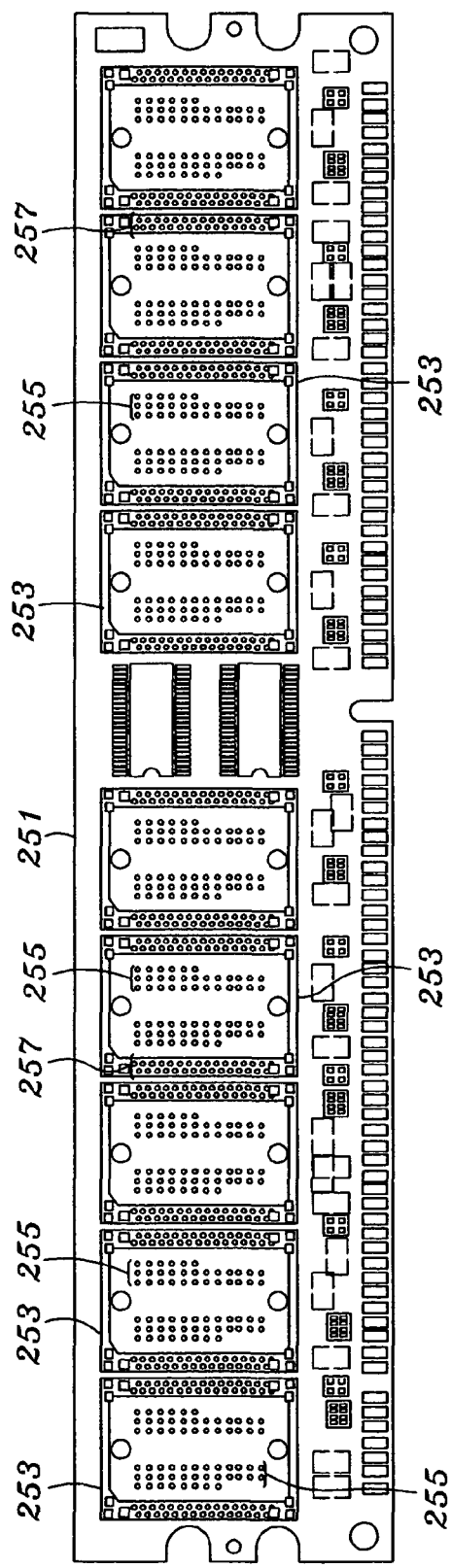
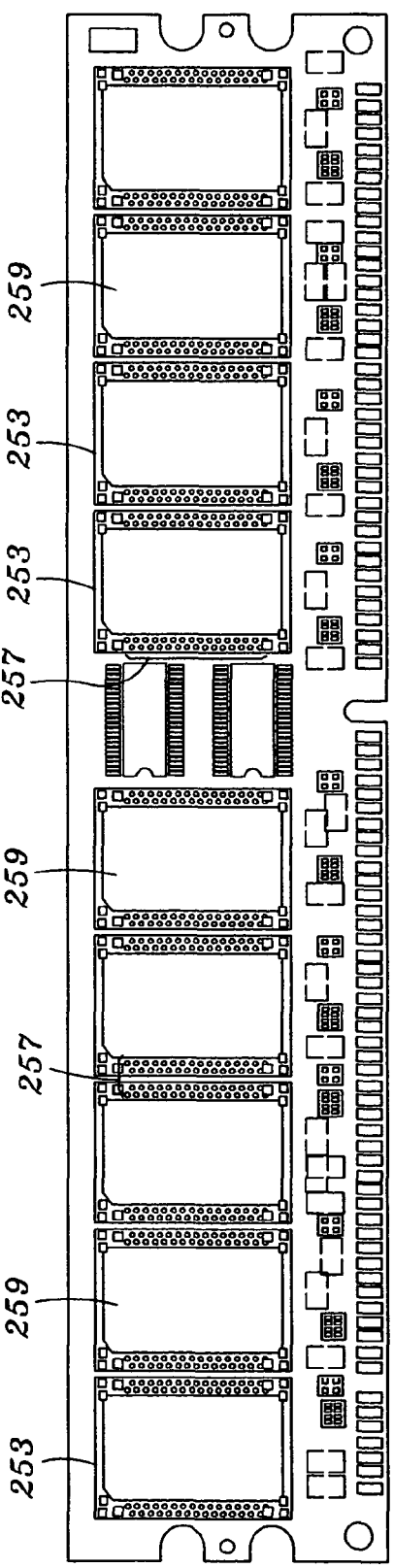
FIG. 16
FIG. 17

Pin Conversion Table

| Conopy™ Pin# | Conopy™ Signal | FBGA Pin# | FBGA Signal | Conopy™ Pin# | Conopy™ Signal | FBGA Pin# | FBGA Signal | Conopy™ Pin# | Conopy™ Signal | FBGA Pin# | FBGA Signal | Conopy™ Pin# | Conopy™ Signal | FBGA Pin# | FBGA Signal |
|---|---|---|---|---|---|---|---|---|---|---|---|---|---|---|---|
| 1 | DQ7 | A1 | DQ7 | 16 | Vss | H2 | Vss | 31 | VDD | R7 | VDD | 46 | NC | H8 | NC |
| 2 | Vss | A2 | Vss | 17 | NC | J1 | NC | 32 | A3 | R8 | A3 | 47 | NC | G7 | NC |
| 3 | NC | B1 | NC | 18 | DQM | J2 | DQM | 33 | A2 | P7 | A2 | 48 | NC | G8 | NC |
| 4 | Vss | B2 | VssQ | 19 | NC | K1 | NC | 34 | A1 | P8 | A1 | 49 | DQ3 | F7 | DQ3 |
| 5 | VDD | C1 | VDDQ | 20 | CK | K2 | CK | 35 | A0 | N7 | A0 | 50 | Vss | F8 | VssQ |
| 6 | DQ6 | C2 | DQ6 | 21 | A12 | L1 | A12 | 36 | A10 | N8 | A10 | 51 | VDD | E7 | VDDQ |
| 7 | DQ5 | D1 | DQ5 | 22 | CKE | L2 | CKE | 37 | BA1 | M7 | BA1 | 52 | NC | E8 | NC |
| 8 | NC | D2 | NC | 23 | A11 | M1 | A11 | 38 | BA0 | NC | BA0 | 53 | NC | D7 | NC |
| 9 | NC | E1 | NC | 24 | A9 | M2 | A9 | 39 | NC | L7 | NC | 54 | DQ2 | D8 | DQ2 |
| 10 | Vss | E2 | VssQ | 25 | A8 | N1 | A8 | 40 | CS# | L8 | CS# | 55 | DQ1 | C7 | DQ1 |
| 11 | VDD | F1 | VDDQ | 26 | A7 | N2 | A7 | 41 | RAS | K7 | RAS | 56 | Vss | C8 | VssQ |
| 12 | DQ4 | F2 | DQ4 | 27 | A6 | P1 | A6 | 42 | NC | K8 | NC | 57 | VDD | B7 | VDD |
| 13 | NC | G1 | NC | 28 | A5 | P2 | A5 | 43 | WE# | J7 | WE# | 58 | NC | B8 | NC |
| 14 | NC | G2 | NC | 29 | A4 | R1 | A4 | 44 | CAS# | J8 | CAS# | 59 | VDD | A7 | VDDQ |
| 15 | NC | H1 | NC | 30 | Vss | R2 | Vss | 45 | VDD | H7 | VDD | 60 | DQ0 | A8 | DQ0 |

FIG. 19

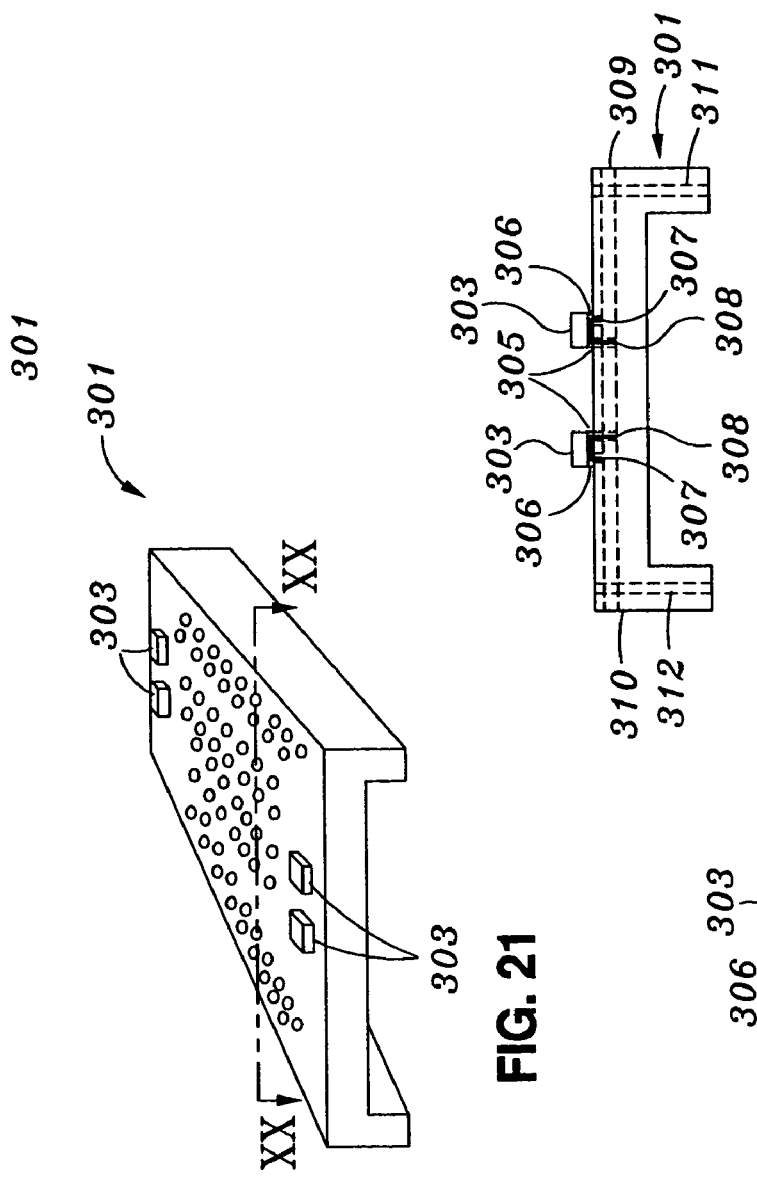
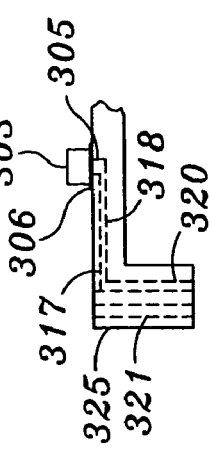
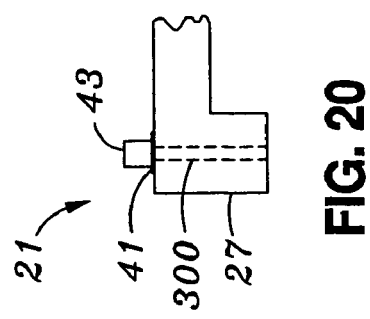

MODULAR INTEGRATED CIRCUIT CHIP CARRIER

The present application claims priority under 35 USC § 119(e) from U.S. provisional application Ser. No. 60/360,473, filed 26 Feb. 2002 and entitled A Modular Integrated Circuit Chip Carrier. The present application is a continuation-in-part of, and claims priority under 35 USC § 120 to, U.S. application Ser. No. 09/688,499, filed 16 Oct. 2000, now U.S. Pat. No. 6,545,868, issued 8 Apr. 2003, which is a continuation-in-part of, and claims priority under 35 USC § 120 to, U.S. application Ser. No. 09/524,324, filed 13 Mar. 2000, now U.S. Pat. No. 6,487,078, issued 26 Nov. 2002, which are incorporated herein by reference.

A portion of the disclosure of this patent document contains material that is subject to copyright protection. The copyright owner has no objection to facsimile reproduction by any one of the patent disclosure, as it appears in the Patent and Trademark Office patent files or records, but otherwise reserves all copyright rights whatsoever.

FIELD OF THE INVENTION

The present invention relates to an integrated circuit chip carrier. More particularly a carrier that allows for an increase in the density of integrated circuit (IC) chips mounted on a printed circuit board and among other things, is adaptable to connecting a wide variety of standard IC chip package designs to a printed circuit board in a three dimensional array as well as a system and method for testing the carrier and chips while all are connected into the circuitry of a larger system.

BACKGROUND OF THE INVENTION

Semiconductor chips are typically connected to a printed circuit board or similar structure that in turn interconnects the chips into the rest of circuitry of the computer with which the chip will operate, including other chips on the printed circuit board. In the past the chips were spread out across the printed circuit board on their large flat sides in a simple two-dimensional array. Over the years the trend in the computer industry has been towards more densely packed configurations of chips on a printed circuit boards. Among the causes for this are the increasing demand for larger random access computer memories, demand for faster computers, demand for more compact computers and a push to decrease costs of printed circuit boards by increasing the circuit density on the printed circuit board. In the mid to late 1980's the industry switched over from a technology that attached computer chips to a printed circuit board through holes in the printed circuit board to one that uses various surface mount technologies. With the advent of surface mounting technology, conventional through-holes on printed circuit boards have been replaced with conductive mounting pads mounted on the surface of the printed circuit board. The chips are connected to the board by leads in various configurations such as DIP, etc. This allows for multiple layered circuit boards with a complex network of interconnect lines running between the layers of the circuit board. In turn this allowed for the increase in the density of chips on a printed circuit board that not only decreases the size of the board but also increases the operating speed of the computer by reducing the distance signals have to travel between chips on the board.

The move to surface mount technology resulted in the practice of positioning the chips on the printed circuit board in a variety of configurations to increase chip density on the circuit board and thereby decrease the distance between the chips to speed up operation of the overall system. Layering or positioning the chips on one another to form a three dimensional array is one of the means used to increase chip density on the printed circuit board. The practice of positioning or layering the chips on one another to form a three dimensional array is particularly adaptable to memory chips given the redundancies in their circuits. An example of a significant advance in the stacking of semiconductor chips on a printed circuit board is described in U.S. Pat. No. 6,313,998, which is incorporated by reference herein, it being owned by the same entity as the instant application. U.S. Pat. No. 6,313,998 discloses a carrier with leads and a unique way of positioning one chip over another.

However, as is so typical of the computer industry the technology rushes on and the general trend in the industry is now moving to the use of ball grid array (BGA) type of connections for most semiconductor chip packages. A typical BGA arrangement consists of a set of BGA pads on the bottom of the chip package and a corresponding mirror image array on the printed circuit board. The chip package is then connected to the circuit board by solder balls. BGA types of connectors provide a number advantages among them is elimination of the leads to connect the chip package to the board. Use of a BGA connector decreases the distance the signal has to travel and also eliminate impedance and other interference that can be generated by the leads. There are other advantages well known to those skilled in the art.

However, BGA types of connectors have their own problems among them being an inability to test the BGA connected device while it is connected into the circuitry of a board or other device. IC packages that are connected by leads on the other hand are very easy to test while the device is still connected into the circuit since the long leads can readily have test probes attached to them. On the other hand BGA connected devices by the very nature of the connection are impossible to directly or even indirectly test while they are connected into the circuit. A BGA packaged chip by its very nature is connected by blind pads, i.e. non-exposed pads that can not be accessed. Another problem with BGA type of connectors is the need to develop new techniques that will allow for stacking chips since many if not most of the techniques used to stack chips are for integrated circuit packages that use leads and cannot be readily adapt to BGA type of connectors. Additionally, most of the existing chip stacking devices and methods used to form chips into a three dimensional array tend to be very complicated. They typically cannot work with standard IC packages, be they the lead type or BGA type and generally require the modification of the chip package itself for implementation. Additionally, many if not most of the existing stacking methodologies require special manufacturing steps and/or machines in order to integrate them into standard circuit board assembly and similar processes.

The industry continues to develop new packing techniques to reduce size and enhance signal quality. Among the more recent developments are chip scale packages (CSP). Flip chips are a variation of this type of packaging. Like BGA connections flip chip or CSP packaging relies on blind pads that are not exposed.

Thus, what is needed is a technique and apparatus that will allow for the stacking of semiconductor chip packages on a circuit board that can be used with packages connected by BGA's, CSP, or other type of technology. Such a technique and related devices have to be capable of accepting and connecting in a stacked, three dimensional array on the circuit board without the need for modification of standard semiconductor chip packages that would be used with the apparatus and method. Additionally, such a technique and apparatus should be able to allow for the testing of the various chips and related items without the need for removing the chip or item to be tested from its connection into the circuitry of the overall system.

SUMMARY

It is an objective of the present invention to provide a method and apparatus that will allow for the stacking of semiconductor chips on a circuit board. It is a further objective of the present invention to provide a method and apparatus that can be integrated into current circuit board assembly operations without modification of existing practices. It is further objective of the present invention to provide a method and apparatus that can be used to stack semiconductor chips without the modification of existing semiconductor chip packages.

These and other objectives are accomplished by providing a carrier for stacking integrated circuit chips, the carrier having: a.) a platform with a top surface and a bottom surface; b) a first strut at a first side of the platform and a second strut at a second side of the platform, the struts providing support for the platform and thereby creating a space below the bottom surface of the platform; c) the platform having a pattern of BGA pads on its top surface for receiving at least one integrated chip on the top surface on the pattern of BGA pads, a bottom side of each pad of the pattern of pads being connected to a via that pass down through the platform to a lower layer in the platform wherein the via connects to a conductive path that extend towards the first or second strut; d) the first and second struts having strut vias that extend up through each strut from the bottom of the strut to the top of the strut wherein each of the strut vias connect to a specific conductive path in the platform which specific conductive path connects to a specific via descending from a pad of the pads of the pattern of pads; and e) wherein the carrier forms a modular unit that can accept at least one integrated chip on the top surface of the platform and connect that chip to a printed circuit board to which the carrier is attached and provide in the space below the bottom surface of the carrier room for attaching at least one other integrated circuit chip to the board on which the carrier is attached.

In a further aspect of the present invention of the carrier the upwardly extending vias in the first strut extend up to a top edge of the first side of the platform to thereby expose a top surface of the upwardly extending vias on the top surface of the platform and the upwardly extending vias in the second strut extend up to top edge of the second side of the platform to expose a top edge of the upwardly extending vias on the top surface of the platform.

In another variation of the invention it provides a way to position the pads on which a chip rests directly over a descending via. It does this by filling in the hollow portions left in a via after its fabrication with a non-conductive or conductive filler material. This reduces the space necessary for the pads by avoiding the need to offset the pads from the vias.

In another aspect of the invention it provides a system that can be used with BGA type of connectors, CSP type of connectors or other similar connection arrangements. Additionally, it provides away for testing the components when they are still connected to the carrier of the present invention and connected to a circuit board by providing accessible contact pads points that in one preferred embodiment include adjacent electrical grounds for a testing probe.

BRIEF DESCRIPTION OF THE DRAWINGS

The invention will be better understood by an examination of the following description, together with the accompanying drawings, in which:

FIG. 4 is a cross sectional view along line I—I of the carrier depicted in FIG. 1;

FIG. 5A is a schematic view of a prior art method for connecting a BGA pad to a circuit board;

FIG. 5B is a cross sectional view of the BGA pad and connection in FIG. 5A;

FIG. 5C is a cross sectional view of a connection technique use in a preferred embodiment of the present invention;

FIG. 5D is a cross-sectional view of a connection technique used in a preferred embodiment of the present invention;

FIG. 16 is a top view of a circuit board to which the carriers of the present invention have been attached and before IC chips are placed on top of the carriers;

FIG. 17 is a view of the board of FIG. 16 in which IC chips have been attached to the top of each carrier;

FIG. 19 provides a table of pin connections between the pads of the carrier as depicted in FIG. 18;

FIG. 20 is a view of a corner of a carrier of the present invention showing a via descending from a decoupling capacitor pad;

FIG. 21 is a perspective view of the carrier of the present invention with an alternate placement of decoupling capacitors;

FIG. 21A is a cross sectional view of the carrier in FIG. 21 along line XX—XX;

FIG. 21B is a view of a corner of a carrier of the present invention showing an alternative way for connecting the decoupling capacitors;

DETAILED DESCRIPTION OF THE PREFERRED EMBODIMENT

Figure 1:
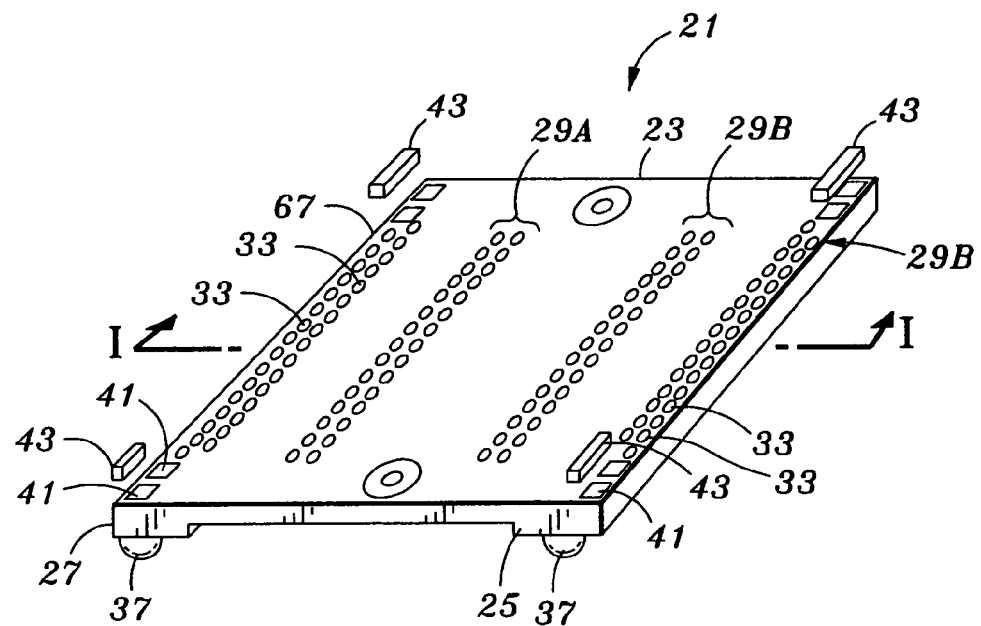
FIG. 1 is a perspective view of a preferred embodiment of the carrier of the present invention.

The present invention provides a chip carrier that allows for the stacking or arranging in a three dimensional array of two or more chips together on a printed circuit board and the interconnection of the stacked chips into the circuitry of the board. FIG. 1 is a perspective view of a preferred embodiment of the chip carrier 21 of the present invention. Chip carrier 21 has top platform 23 and two side struts 25 and 27. An array of BGA pads 29A and 29B on the top of platform 23 are positioned to receive an IC chip that connects by means of a BGA pad array. As will be discussed and illustrated below, pads 29A and 29B connect to vias that descend into platform 23 and then connect by conduction lines running laterally to vias in struts 25 and 27. Top exposed portions 33 of each of the vias in struts 25 and 27 can be seen at the top edge of platform 23 above each strut, 25 and 27. As will be described and illustrated below each of the vias in strut 25 and 27 descent down through strut 25 and 27 and end at a pad or exposed portion to which a solder ball 37 can be attached. Carrier 21 in one of its preferred embodiments has pads 41 for receiving decoupling capacitors 43 on the top of plate form 23. As will be illustrated below the decoupling capacitors connect into the circuitry through appropriately placed vias and conduction lines. Additionally, placement of the decoupling capacitor next to the IC chip enhances operation. The invention thus provides for proper decapacitive decoupling.

Figure 2:
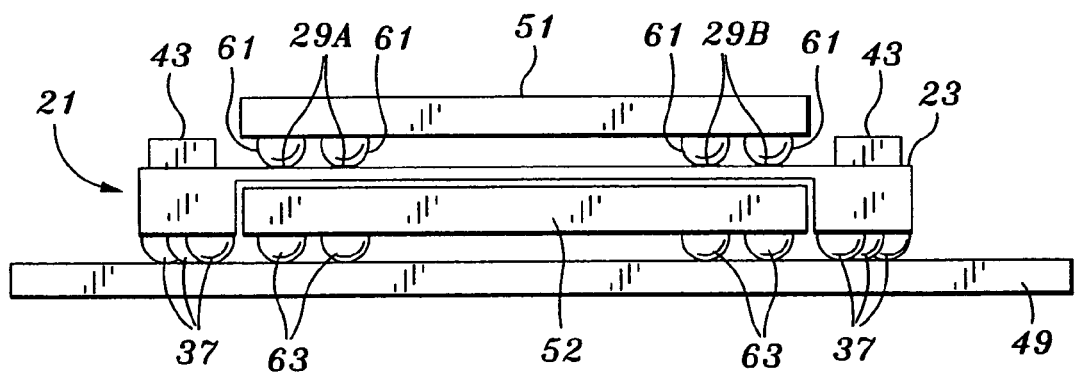
FIG. 2 is a side view of a carrier of the present invention connected to a circuit board and stacked with two IC chips.

FIG. 2 provides a side profile view of a carrier 21 of the present invention connected to a circuit board 49 with integrated circuit (IC) chips 51 and 52. IC chip 51 connects to carrier 21 by means of pads sets 29A and 29B (shown in FIG. 1). IC chip 52 connects by means of a similar BGA pad array sets to board 49. Decoupling capacitors 43 are positioned on carrier 21 at the corners of its platform 23. As noted above the array of pads 29A and 29B on platform 23, to which balls 61 of the BGA array of IC chip 51 attach, have vias descending below them into platform 23 which connect to conductive lines that connect to vias in struts 25 and 27. Solder balls 37 connect to the bottoms of the vias in struts 25 and 27 to board 49 and provide the final electrical connection to board 49. IC chip 52 connects to board 49 through solder balls 63 in the typical BGA pad array on board 49 not shown.

In the embodiment of the invention depicted in FIGS. 1 and 2 the pads of the decoupling capacitors 43 have their own conductive vias descending down through each strut 25 and 27 that terminate in a solder ball 37. The decoupling capacitors allow for impedance control, help control return current and store charge.

Figure 3:
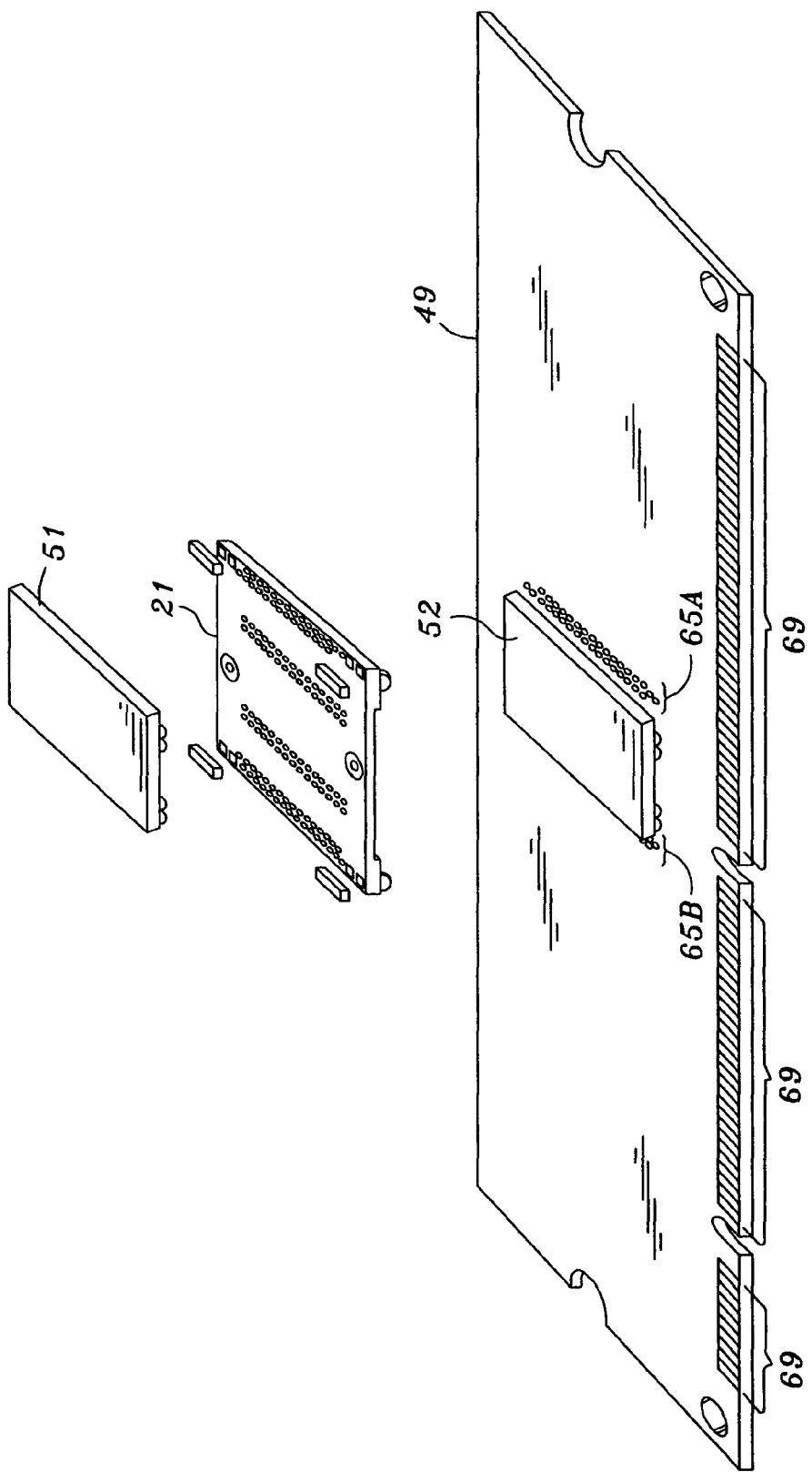
FIG. 3 is an exploded view of the carrier of the present invention and components with which it would be connected to a circuit board.

FIG. 3 provides an exploded view of board 49, IC chip 52, carrier 21 and IC chip 51. Carrier 21 connects to board 49 by means of BGA pad array 65A and 65B. Board 49 would have a series of sets of IC chips arranged in a three dimensional array by use of carriers which are the same as or similar to carrier 21. Board 49 is the typical printed circuit board with layers of metalized and prepreged sheets that form a laminate structure with various conducting lines in it, not shown, that connect the devices, in this case IC chip 52 and carrier 21 and thus IC chip 51. Board 49 has connectors 69 along its bottom edge that connect the internal lines within board 49 to the rest of a system when board 49 is plugged into the appropriate socket in a computer. Board 49 is the typical board that might hold IC memory chips or similar chips. FIG. 3 is only meant to provide an example of one setting in which the present invention and can be used. The present invention can be used in a wide variety of other configurations of printed circuit boards including positioning them on the main motherboard of a computer.

Carrier 21, in its preferred embodiment, is made in the same fashion as a printed circuit board in that it has laminate layers with vias and conducting lines laid out in the layers of platform 23 and struts 25 and 27 of carrier 21. FIG. 4 provides a cross-sectional view of carrier 21 along line I—I of FIG. 1. Platform 21 has pad sets 29A and 29B on top and vias 73A, 73B, 73C and 73D. Vias 73A, 73B, 73C and 73D descend to connecting paths 75A, 75B, 75C and 75D. The connecting path for pad 75B is behind path 75A and is thus hidden by 75A. Also, connecting path 75C is partially hidden by connecting path 75D. Naturally, all of the connecting paths are electrically isolated from each other. Although from this perspective the connecting paths 75A, 75B, 75C and 75D appear to run together as will be explained below with another figure it is a matter of perspective of the drawing. The conductive paths 75A, 75B, 75C and 75D from each of the vias 73A, 73B, 73C and 73D run to vias in one of the struts 25 and 27. This is best illustrated by conductive path 75D that runs from via 73D to via 77D in strut 27 and conductive path 75A that runs from via 73A to via 77A in strut 25. The conductive paths and vias are electrically conductive paths.

The vias are made of a copper core in the preferred embodiment and the conductive paths also are made of copper. Thus, via 77D and 77A are copper cores and vias 73A, 73B, 73C and 73D are copper cores. Conductive paths 75A, 75B and 75D are all made of copper in the preferred embodiment. Naturally, all of the other vias and conductive paths of carrier 21 are made of copper in the same fashion as those shown in FIG. 4. However, any suitable electrically conductive material can be used. As depicted in FIG. 4 and can be seen in FIGS. 1 and 3 the top ends of the vias in struts 25 and 27 have exposed ends that appear at two of the top edges of platform 23 at the top of struts 25 and 27. The vias in struts 25 and 27 do not have to have exposed top ends such as 79A of via 77A and 79D of via 77D to provide a functioning carrier, and in fact the top ends could be covered by platform 23 as an alternative design. However, constructing these vias with the exposed top ends gives carrier 21 a number of unique features that will be mentioned here briefly and explained in more detail below. The exposed top ends on the vias in struts 25 and 27 provide exposed contacts points with which to test the internal circuitry of carrier 21 and IC chips 51 and 52 when they are all connected to a printed circuit board. Exposed top ends of the vias also provide an avenue for dissipation of heat. Additionally, the exposed top ends provide pads for placing one or more carriers similar to carrier 21 on top of each other to form a multi-stacked, three-dimensional array of carriers and IC chips. Also, extending vias 73A, 73B, 73C and 73D from the BGA pads on platform 23 down to the bottom of platform 23 adds additional heat dissipation capability to carrier 21. Another option is to leave the tops of the vias in the struts exposed during installation and testing and to cover them after this is completed. Additionally, the given the fact that in a preferred embodiment the carrier is fabricated in layered fashion similar to a circuit board the vias can also be blind or buried as well as through vias.

In the preferred embodiment of the present invention the vias 73 of BGA pads 29A and 29B are placed directly under the pads of the BGA array on the top of platform 23. This is a unique way of placing vias since it has been customary to offset the vias from the pads as depicted in FIG. 5A a top view showing one BGA pad 81 and top end of a via 85 and the connecting conductive link 84. One of the reasons pad 81 is offset from pad 83 is the fact that it has a hollow center core 86. Hollow center core 86 is a result of the fact that copper, or some other conductive material, is applied by a plating process that typically leaves a hollow core. Thus with the existence of hollow core 86 it is impossible to construct a pad over via 85. FIG. 5B is a cross sectional view of via 85 along V—V of FIG. 5A. FIG. 5B shows hollow core 86 in via 85 with copper lining. In one standard fabrication process, vias, which descend through one or more layers of a circuit board are cut by a small mechanical drill bit, a laser drilling appliance, or some other device, that can achieve a similar result. Once the via is bored, it is plated with a conductive material, typically copper. However, the pads could be offset from the vias as depicted in FIGS. 5A and 5B without departing from the spirit of the present invention. However, these techniques as noted have their drawbacks.

The present invention, in a preferred embodiment, provides a solid core via without a hollow shaft or core 86. One version is depicted in FIG. 5C. FIG. 5C shows conductive material 87 and BGA pad 89 configuration according to one alternative embodiment of the present invention. The via 88 in FIG. 5C could be fabricated by a layering of copper or other conductive material 87 as the layers of the carrier are formed in to form via 88 channel. As noted above, placing of the downwardly descending vias directly under the pads on top of the carrier reduces the space needed for the carrier and related circuitry. In another alternative, the present invention provides filling the hollow core left in the via after the application of the conductive material with a non-conductive, or conductive material. FIG. 5D shows the hollow core 86 after it is filled with a conducting, or non-conducting material 91. Thus, via 90 is filled solidly with the conductive material 92 and material 91 to fill hollow core 86. Thus pad 93 can be applied to the top of via 90. Naturally, the vias in carrier 21 and those in the struts 25 and 27 can be fabricated in the same fashion.

Figure 6:
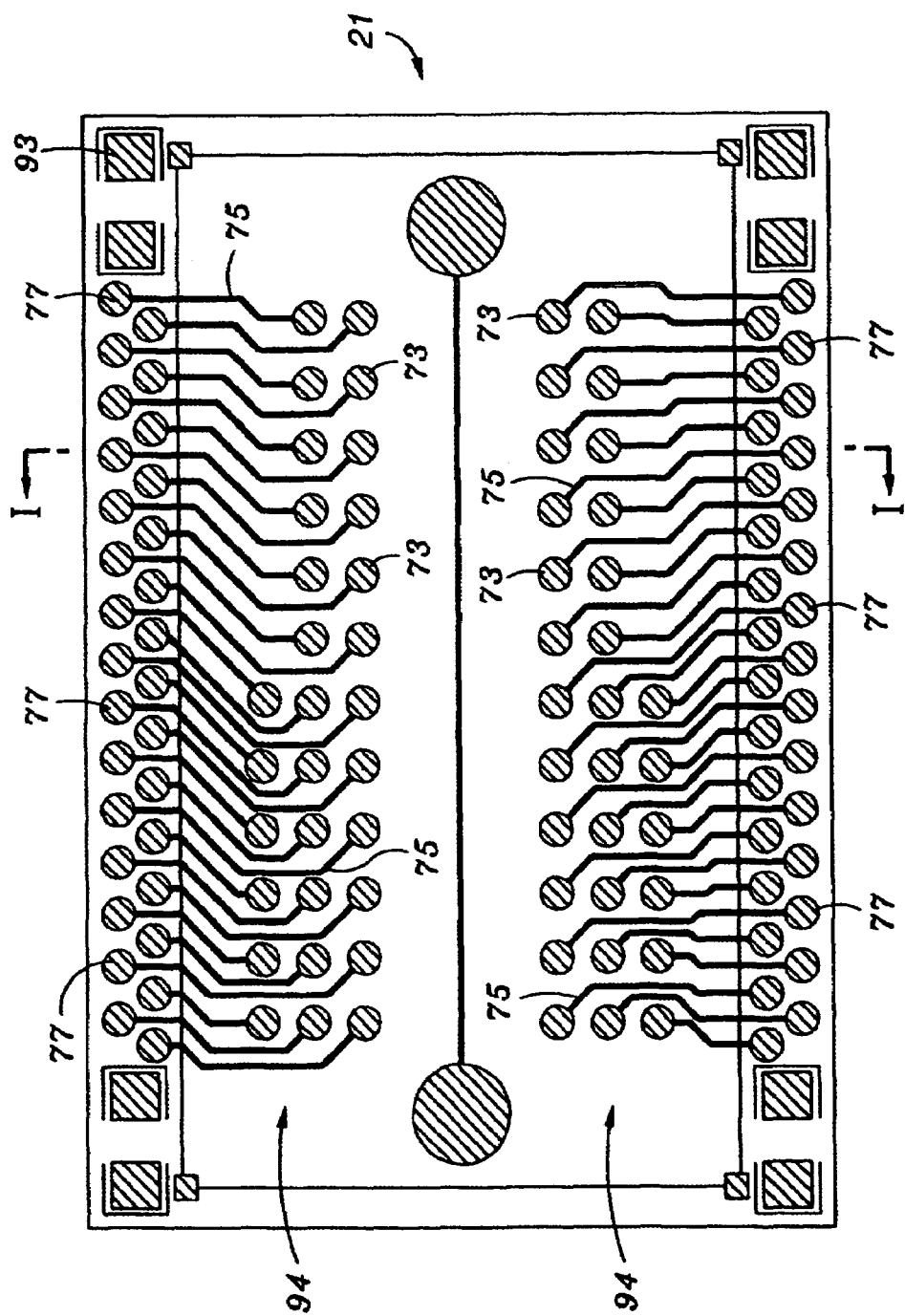
FIG. 6 is a schematic view of typical circuitry on a lower routing layer of the carrier of the present invention.

FIG. 6, a diagram of a lower routing layer of the carrier, provides a schematic diagram of an example of how the circuitry can be configured for a carrier made according to a preferred embodiment of the present invention. The vias 73 of the BGA array of carrier 21 connect by conduction paths 75 to specific vias 77 in the struts. For reference the cross sectional view of FIG. 4 would be along line I—I as noted in FIG. 6. As can be seen in FIG. 6 as well as some of the other FIGS. vias 77 of the struts in the preferred embodiment are arranged in a staggered array to optimize space along the edges of carrier 21. Connections 93 for the decoupling capacitor pads can also be seen in FIG. 6. One of the unique features of the carrier of the present invention is that the pattern of the array of pads on the top platform can be easily configured to accommodate a wide variety of currently manufacture IC chip packages with little or no changes in the structure of the carrier. The internal circuitry of carrier 21 can be configured to accommodate a wide variety IC chip and provide an appropriate connection of the IC chip to the circuit board.

Figure 7A:
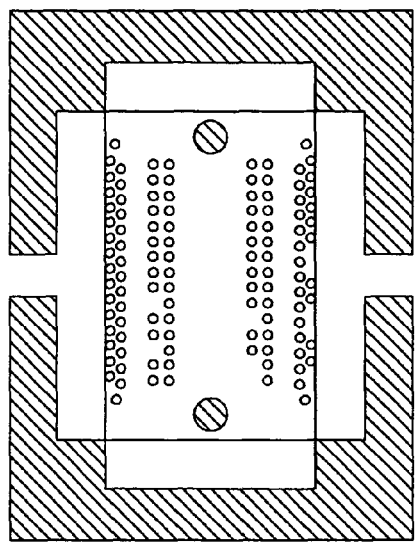
FIG. 7A–7D provide one example of primary layers that make up the various layers of one example of the carrier of the present invention.
Figure 7B:
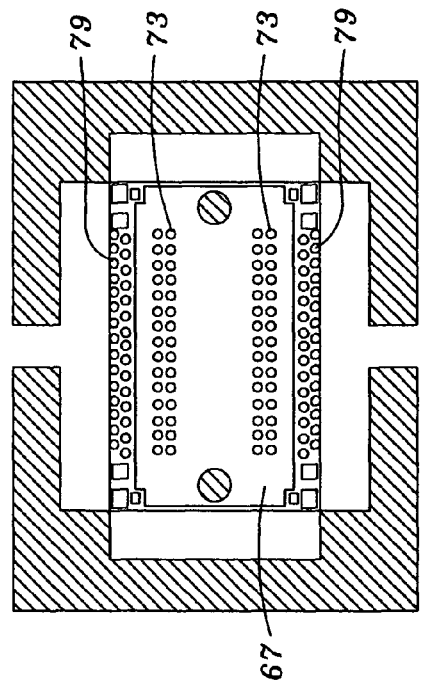
Figure 7C:
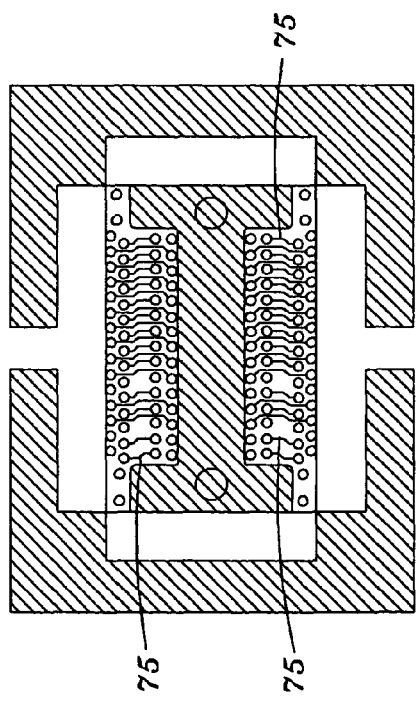
Figure 7D:
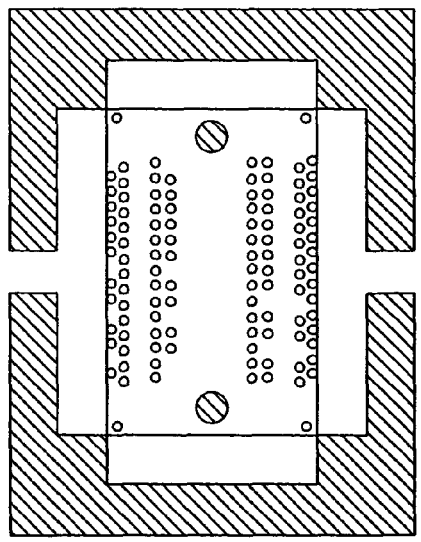

As noted above, in its preferred embodiment, the carrier of the present invention is fabricated in the same fashion as the standard printed circuit board. In its preferred embodiment, the carrier would have two to four or more layers. FIGS. 7A, 7B, 7C and 7D provide a schematic view of the various layers that could make up the top platform of the carrier. FIG. 7A depicts the bottom layer that contains electrically conductive paths 75. FIG. 7B depicts the internal ground layer, FIG. 7C depicts the internal power layer, and FIG. 7D depicts the top layer with the arrangement of pads to which an IC chip would be connected. FIGS. 7B and 7C are negative views of the layer depicted while FIGS. 7A and 7D are the positive views. Additionally, in FIG. 7D in the preferred embodiment of the invention, the exposed ends 79 of the vias and the pads 73 of the BGA array are electrically isolated from the surrounding surface of the carrier. In the preferred embodiment the surface area 73 is an electrically conductive material such as copper. In a preferred embodiment, a small area 67, surrounding each pad 73, but electrically isolated from pad 73 provide a ground area adjacent to each pad 73 and tops of the vias 79 for testing purposes, etc. As is well known in the art, the layers depicted in FIGS. 7A, 7B, 7C and 7D are separated by prepreg layers that bond the layers together and also electrically isolate them.

Figure 8A:
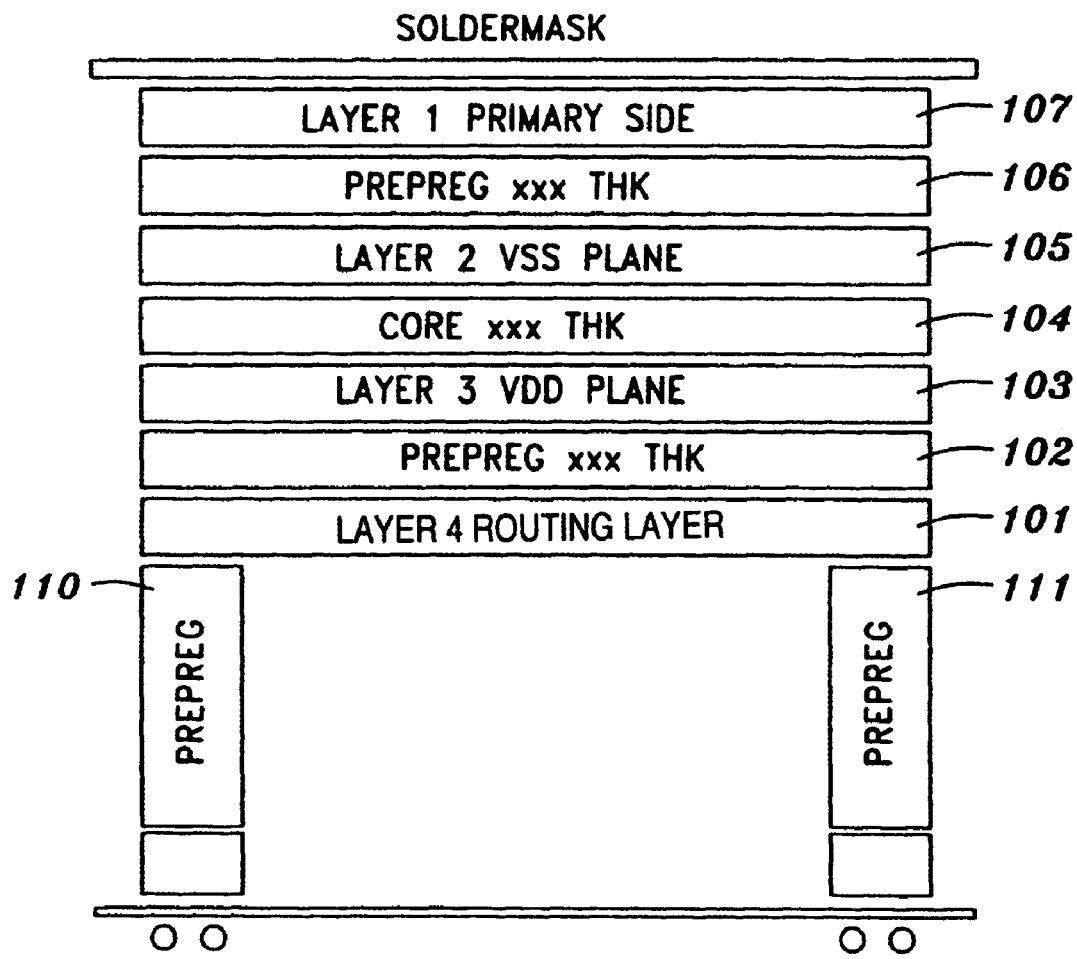
FIG. 8A is a cross sectional schematic view of the principal layers of one version of the carrier of the present invention.

FIG. 8A is a schematic side view of the sequence of layers that could make up the carrier with the layers depicted in FIGS. 7A to 7D. In FIG. 8A routing layer 101 is the bottom most layer. Next is prepreg layer 102 with ground layer 103 above it. Core layer 104, located at the center of the carrier, would next follow ground layer 103. Then, power layer 105, would be next followed by prepreg layer 106, and finally, top routing layer 107.

Making chip carrier 21 out of the same material as the printed circuit board to which it wilt be attached provides a number of significant advantages. Among them are that carrier 21 wilt be compatible with the other items in the circuitry of the printed circuit board to which it will connect. Incorporation of chip carrier 21 of the present invention into the circuitry of a board during the design process wilt not pose a significant problem since the electrical characteristics of the carrier will be well known and compatible with the other elements of the circuitry.

In the preferred embodiment of the present invention struts 110 and 111 are made of prepreg laminate type of materials also. The struts are built up in layers of laminated material. Other methods are possible such as an injection molding process.

Figure 8B:
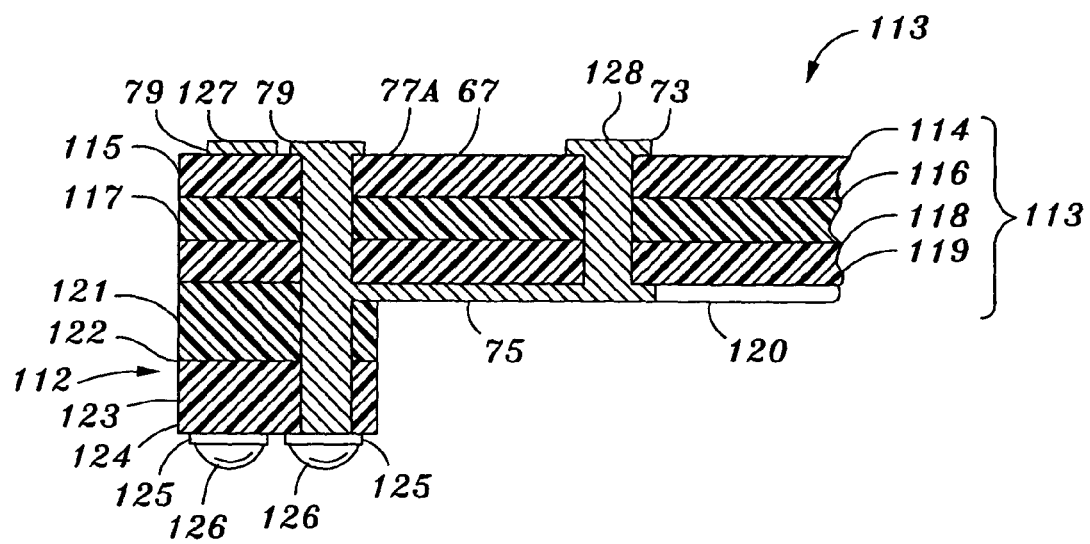
FIG. 8B is a cross section of a portion of the carrier of the present invention that shows the layers that make up the carrier.

FIG. 8B provides another cross sectional view of a strut 112 and a portion of the platform 113 of the carrier of the present invention. The layers discussed above can be seen starting with the top layer 114, which has the pattern of BGA pads, below that is first prepreg layer 115. The prepreg layers as is well known in the industry is a laminate material that provides insulation between the conductive layers as well as the rigidity and support necessary to form the circuit board or in this case the carrier. Below first prepreg layer 115 is power plane layer 116, which has on its lower side a second prepreg layer 117. Below the second prepreg layer 117 is ground plane 118 followed by third prepreg layer 119 below it. Finally at the bottom of platform 113 is lower routing layer 120. Layers 114, 115, 116, 117, 118, 119 and 120 thus form platform 113 in a preferred embodiment. The layers continue with the formation of strut 112 by a fourth prepreg layer 121 another intermediate layer 122, a fifth prepreg layer 123 and ending in bottom layer 124 at bottom of which are pads 125 of vias 77. Vias 77 as discussed above descend down through the top edge of platform 113 through strut 112 to terminate in a pad 125 to which a solder ball 126 is attached for connecting the carrier to a circuit board or another carrier as will be discussed below. In the preferred embodiment of the present tops 79 of vias 77 in strut 112 terminate in pads 127.

Only one of the vias 77A of strut 112 is shown in cross section in FIG. 8B since in the preferred embodiment the vias 77 along the edge of the carrier are staggered to economize on space. Strut vias that descend through the edge of the platform into the strut could be aligned side by side without departing from the principals of the present invention. Via 73 shown in cross section and as discussed above and depicted in other FIGS. in this specification connects pad 128 of the array of BGA pads of the IC chip package to conductive Line 75 that in turn connects to via 77A. Conductive path 75 as noted above is made of a copper trace. However, any other suitable conductive material can be used. As noted elsewhere in this specification, in the preferred embodiment vias 77 and 73 are solid copper cores that are laid down during the fabrication process of the carrier. The conductive cores that make up the vias terminate at the top and bottom of each strut of the carrier and thus provide heat dissipation channels. As noted elsewhere in this specification the channels in which the vias are formed could also be made by drilling a hole into the layers of the carrier and plating that hole with copper or other suitable conductive material.

Fabricating the carrier in a multilayer fashion as noted provides a number of advantages. It allows for impedance and matching of the carrier with circuit board, so that the carrier can be tailored to work with any standard IC chip without having to modify the chip, etc. Additionally, a stepped laminate process, depth routing or other construction method, can be used to fabricate the vias and conductive paths in the carrier. Although the preferred embodiment disclosed is a fabricated in the same fashion as a circuit board with multiple layers there are many applications that do not require a carrier with multiple layers. The carrier for a variety of applications could be fabricated by an injection molding process or similar process. Even with a carrier fabricated by an injection molding process, its structure can be tailored.

As noted above, the semiconductor industry has generally adopted the use of the BGA type of connectors for integrated circuit chips. The improvements in performance of the systems connected with BGA type of connectors, as well as a host of other reasons, have dictated this transition to BGA connections from leads. However, one of the advantages of using leads to connect integrated circuit chips to the board or other holders was the fact that if problems developed after installation with the chip or related devices, the leads could be easily accessed to conduct tests on the components without their removal from the circuit. However, with chips connected by BGAs, removal of the problem unit from the circuit of the printed circuit board or other device is necessary in order to test components, since all of the balls connecting the unit are not accessible when the subject unit is connected to the circuit. However, removing a chip or other unit from the circuitry in which it is experiencing problems can completely change its operational characteristics and thus makes it difficult if not impossible to determine the actual cause of the original problem. There are ways to approximate the operational setting in which the chip or device is experiencing problems. However, the time and effort to do this makes it a very expensive, inefficient, and an error prone process.

Figure 9:
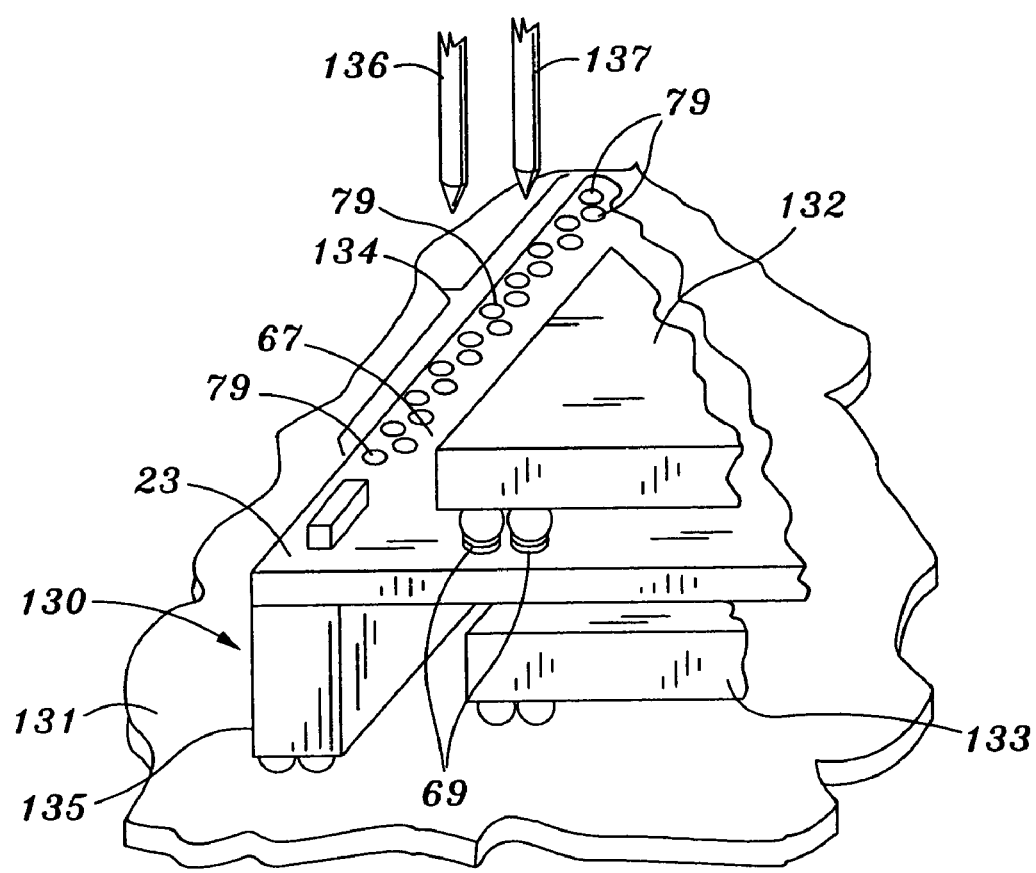
FIG. 9 is a cut away perspective view of a version of the carrier of the present invention attached to a circuit board with stacked BGA devices.

One of the significant advantages of the present invention is that it provides a means and method for testing the IC chips as well as the carrier while they are all still connected into the circuitry of the printed circuit board. This, as noted above, can be done through the exposed top ends 79 of the vias 77 in the struts, not shown in FIG. 9. FIG. 9 provides a perspective view of a corner of a carrier 130 of the present invention connected to a circuit board 131. Connected to the top of carrier is an IC chip 132 connected to carrier 130 by a BGA array. Connected to circuit board 131, underneath carrier 130, is another IC chip 133. Exposed along the top edge of carrier 130, are part of an array of exposed top ends 134 of the vias in strut 135. Given the exposed position of the top ends 79 of the vias, probe points 136 and 137 from one or more test devices can be placed against the exposed top ends and a variety of test conducted to determine the cause of any problems with the circuitry and devices. This ability to test the carrier of the present invention and the IC chips or other BGA devices connected to it and positioned underneath it while all are still connected to the printed circuit board not only makes the test results very accurate it makes it very efficient and easy to do. Tests using the exposed top ends 79 of the vias of the struts could be made part of the standard quality control tests conducted during an automated fabrication process. This could be done in a number of ways including using a clamshell type of testing device with multiple probe points that would be momentarily connected to the exposed array 134 of the tops of the vias in the struts.

Figure 8C:
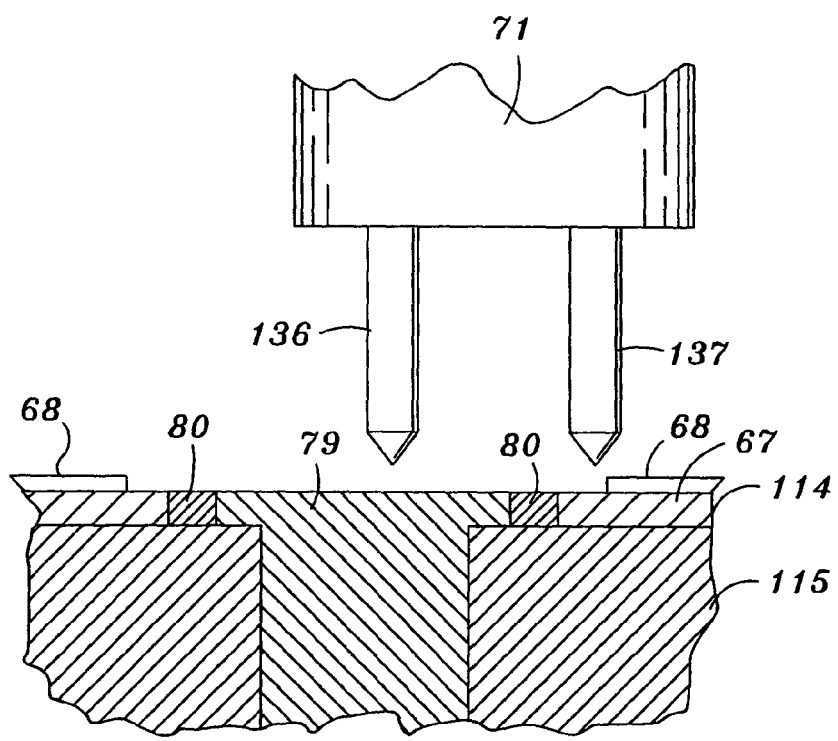
FIG. 8C is a cross sectional view of one embodiment of a pad and part of a via in the strut of the carrier of an embodiment of the present invention.

Referring to FIG. 8C, and 9, top exposed ends 79 of the upwardly extending vias are electrically isolated from the surrounding area 67 on the top of platform. The vias and pads of the BGA array 69 are also electrically isolated by material 80 from the surrounding area 67 of the top of platform 23. In the preferred embodiment much of top area 67 is covered with a copper layer. This copper layer 67 acts as a heat sink. A top insulating layer 68, covers a portion of layer 67. It also provides a convenient ground contact point for testing the unit 71. For example one of the probes 136 or 137 in FIG. 9 and FIG. 8C could be placed against a top end 79 of one of the vias and the other could be placed against area 67 to form the ground. Given the speed and sophistication of the circuits being tested on the carrier of the present invention and related IC chips, very precise test equipment is needed to conduct the tests. Having the ground adjacent to the contact point at which the test is to be conducted makes it very convenient since the probe points 136 and 137 of the testing equipment are often placed adjacent to each other in the test probe 71 as illustrated in FIG. 8C.

The structure of the carrier of the present invention provides an additional alternative for providing an adjacent ground for testing of the circuits. One or more of the tops of the exposed vias in the strut will most likely be a ground connection. Thus, is conducting a test this exposed via can be used as the ground test and it would be not be necessary to provide a special adjacent ground location for a test point.

Figure 10:
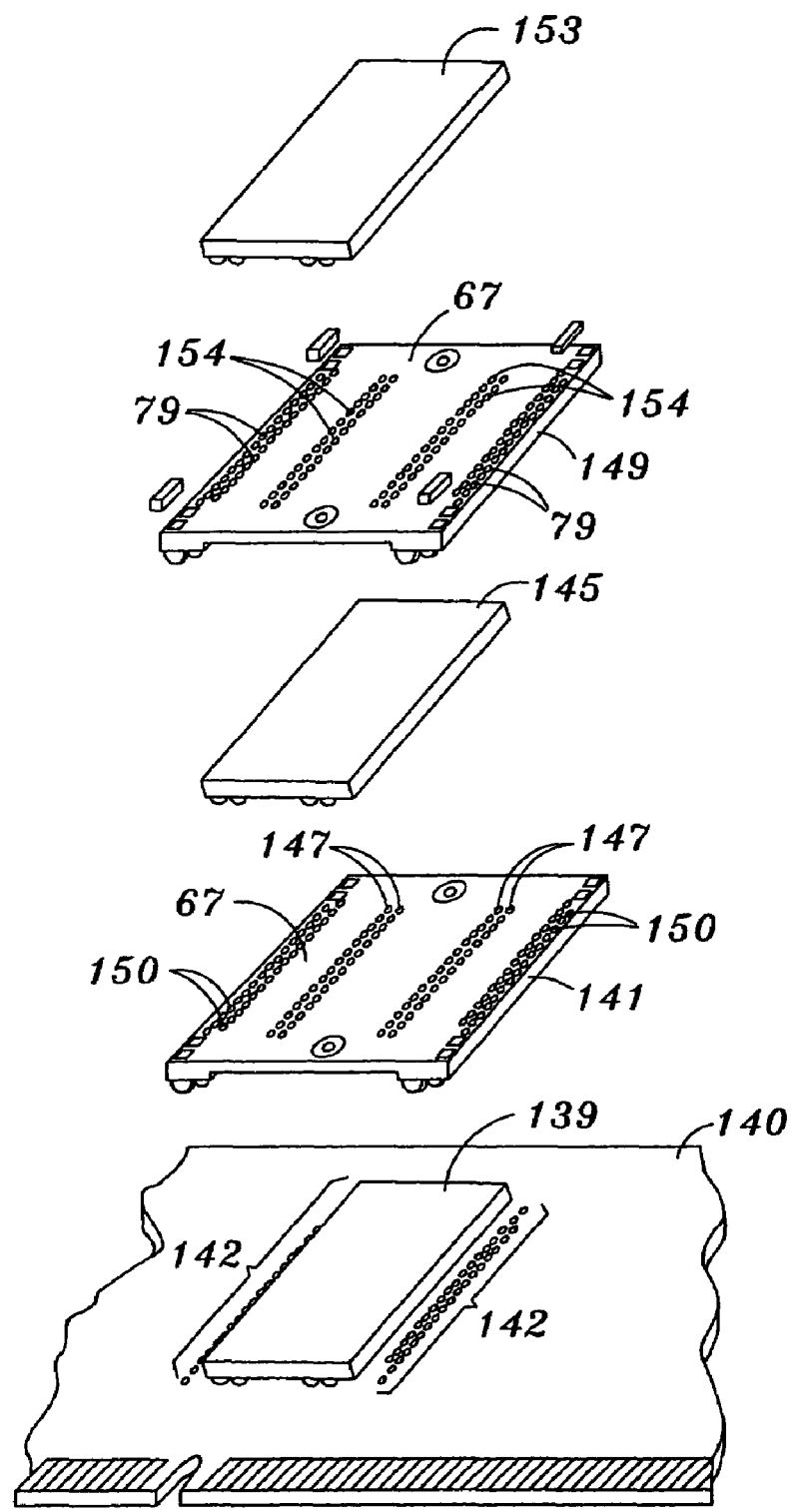
FIG. 10 is an exploded view of double-stacked carriers of the present invention with BGA devices.
Figure 11:
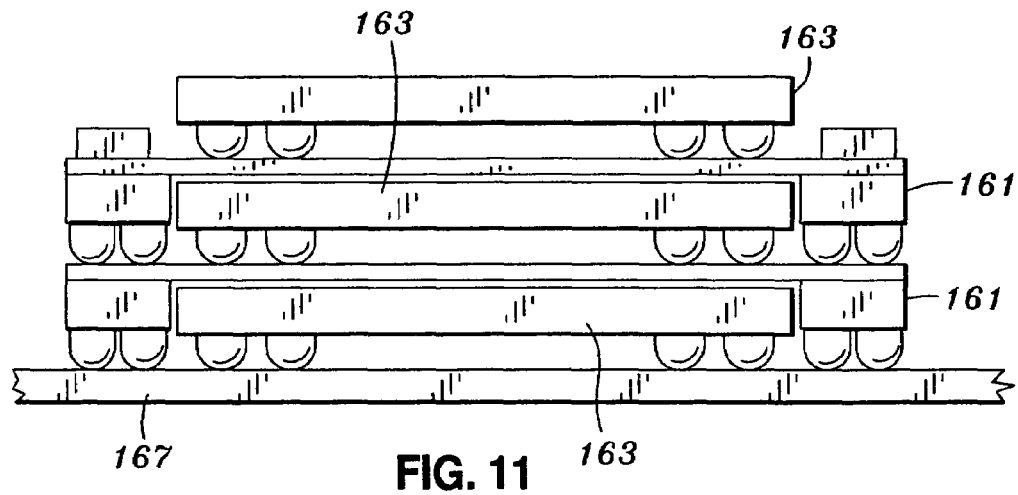
FIG. 11 is an end view of two carriers of the present invention stacked with BGA devices.
Figure 12:
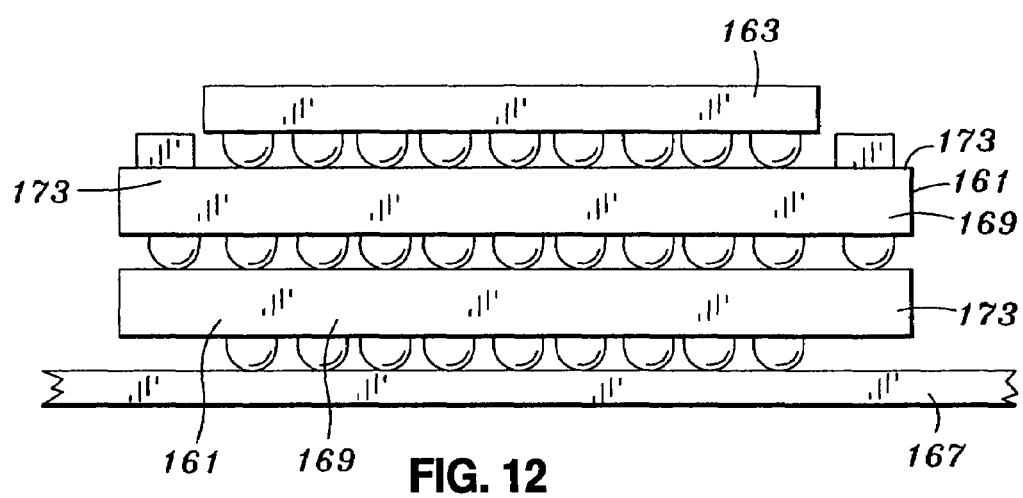
FIG. 12 is a side view of two carriers of the present invention stacked with BGA devices.

Another advantage alluded to above with respect to the providing of the array of exposed via tops 134 (FIG. 9) is the ability to stack multiple carriers and IC chips in an enlarged three dimensional array. FIG. 10 is an exploded view of how the chips and carriers would be stacked. In FIG. 10 the first BGA device 139 attaches to circuit board 140 by a standard BGA array. In turn carrier 141 connects to circuit board by an array of BGA pads 142 located on either side of BGA device 139. In turn BGA device 145 connects to the top of carrier 141 with BGA pad array 147. In turn carrier 149 attaches to carrier 141 on by means of the array 150 of exposed top ends of the vias in the struts of carrier 141. Finally, BGA device 153 attaches to carrier 149 by means of an array of BGA pads 154 on top of carrier 149. While only two stackable carriers are illustrated in FIG. 10 a multiplicity of carriers could be stacked on each other with attached BGA devices. FIG. 11 provides an end of view of two tiered carriers 161 and attached BGA devices 163 on circuit board 167 that form an enlarged three-dimensional array. FIG. 12 provides a side view of a stacked array of carriers and BGA devices. In FIG. 12 the BGA devices underneath each of the carriers 161 cannot be seen due to position of struts 169 of each carrier 161.

Figure 13:
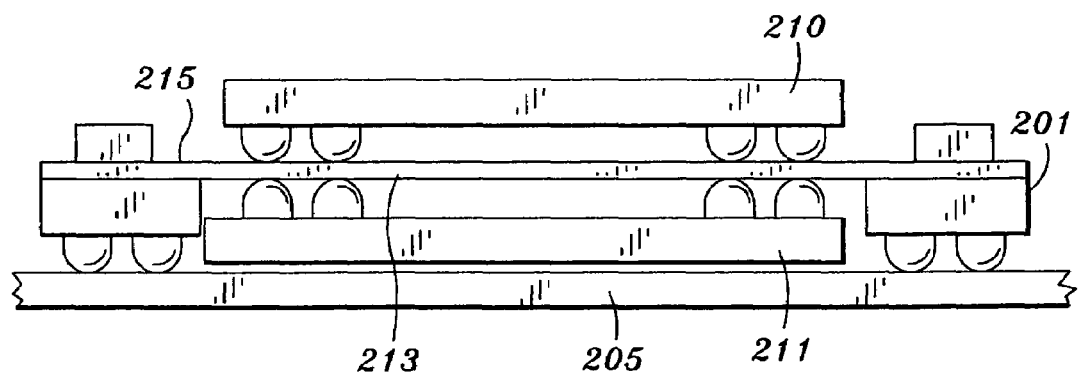
FIG. 13 is a view of another version of the carrier of the present invention in which IC chips are attached to both sides of the carrier.

Another version of the carrier 201 of the present invention is depicted in FIG. 13. Carrier 201 is attached to printed circuit board 205. An IC chip 210 is attached to carrier 201 in the manner described above. However, IC chip 211 instead of being attached to board 205 underneath carrier is attached to the bottom surface 213 of platform 215 of carrier 201. Attaching of IC chip 211 to the bottom of carrier 201 is done with an array of BGA pads that are positioned along the bottom surface 213 of carrier 201. This array would be the same as that depicted above. Any number of different circuitry connections could be made to in turn connect IC chip 210 and 211 into the circuitry through carrier 201. In fact they are too numerous to mention. This is one of the significant advantages of the present invention in that the carrier can be configured with appropriate BGA pad arrays and circuitry to hold virtually any IC chip that can fit into the space on the top or bottom of platform 215 of carrier 201.

Figure 14:
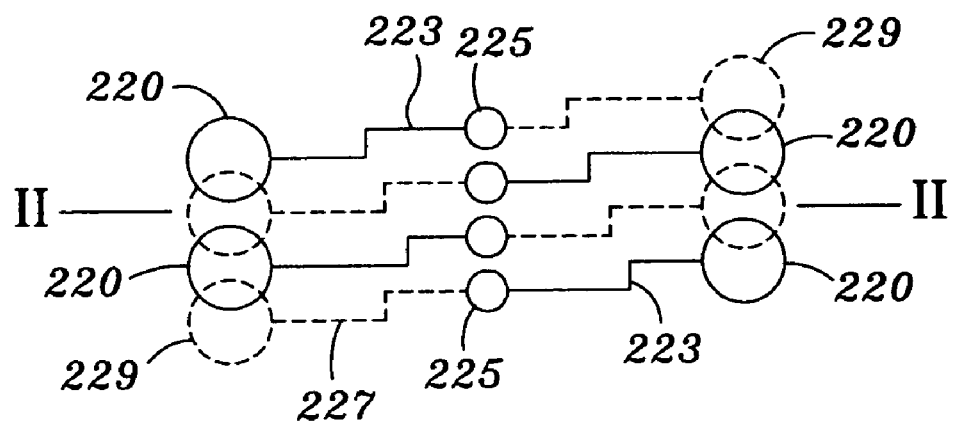
FIG. 14 provides a schematic type diagram of one way to connect the pads on the version of the carrier depicted in FIG. 13.
Figure 15:
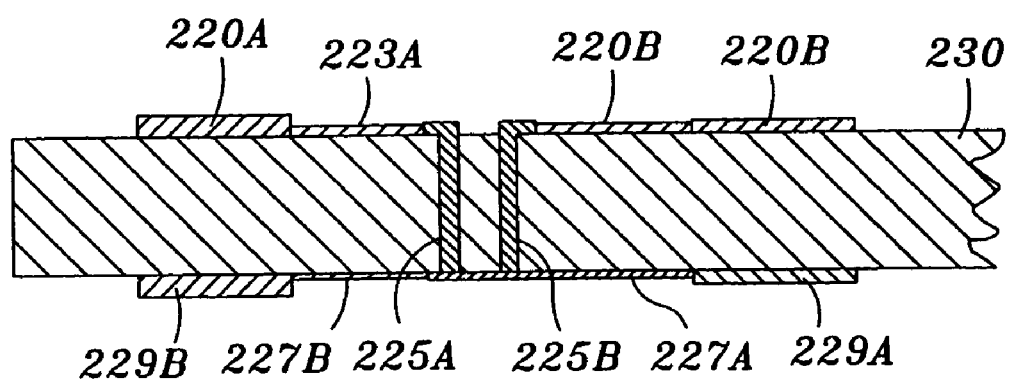
FIG. 15 is a cross sectional view along line II—II of FIG. 14.

FIG. 14 provides a view of one potential circuitry arrangement of pads that might be used with memory IC chips given the redundancies of their circuits with carrier 201 (FIG. 13). In FIG. 14 top pads 220 in solid outline are located on the top of the platform of the carrier. Each pad 220 on top connects by a solid line 223 to one of the vias 225. As noted previously the vias descend through the platform to the bottom layer of the platform where they each connect to a line 227 shown in outline form. In turn each line 227 connects to a pad 229, shown in outline form on the bottom of the carrier. As can be seen a pad 220 on top and a pad 229 on the bottom each connect to the same via. However, the one on the bottom is offset from the one on top. This is due to the fact that the example used here is that of memory chips that will have the same arrangement and when placed on either side of a carrier like pads that can be connected together from each IC memory chip used in this example will be offset form each other when the bottoms of each of the chips face each other. FIG. 15 provides a cross sectional view along line II—II of the platform shown in FIG. 14. As can be seen a pad on top 220A connects by line 223A to via 225A. Via 225A descends down through platform 230. Via 225A connects to line 227A. Line 227A in turn connects to pad 229A.

One advantage of the version of the carrier depicted in FIG. 13 is that the printed circuit board can be made to a standard configuration to work with the carrier 201 depicted in FIG. 13. Thus, the only item that has to be wired to handle the IC chips are carrier 201.

FIG. 16 provides one example of a printed circuit board 251 populated with the carriers 253 of the present invention. In FIG. 16 the IC chips that would go on top of carriers 253 have not been added yet. Thus one can see the BGA pads 255 with which IC chips will be attached to the top of each carrier 253. Also visible are the pads 257 at the tops of the vias that descend down through the platform and struts underneath. In FIG. 17 the IC chips 259 have been attached to the tops of the carriers 253. BGA pads 255 are no longer visible, since the chips 259 now cover them. However, the pads 257 at the top of each via that descends down through the platform and struts of the carrier are clearly visible and accessible for testing and other purposes described above and below.

Figure 18:
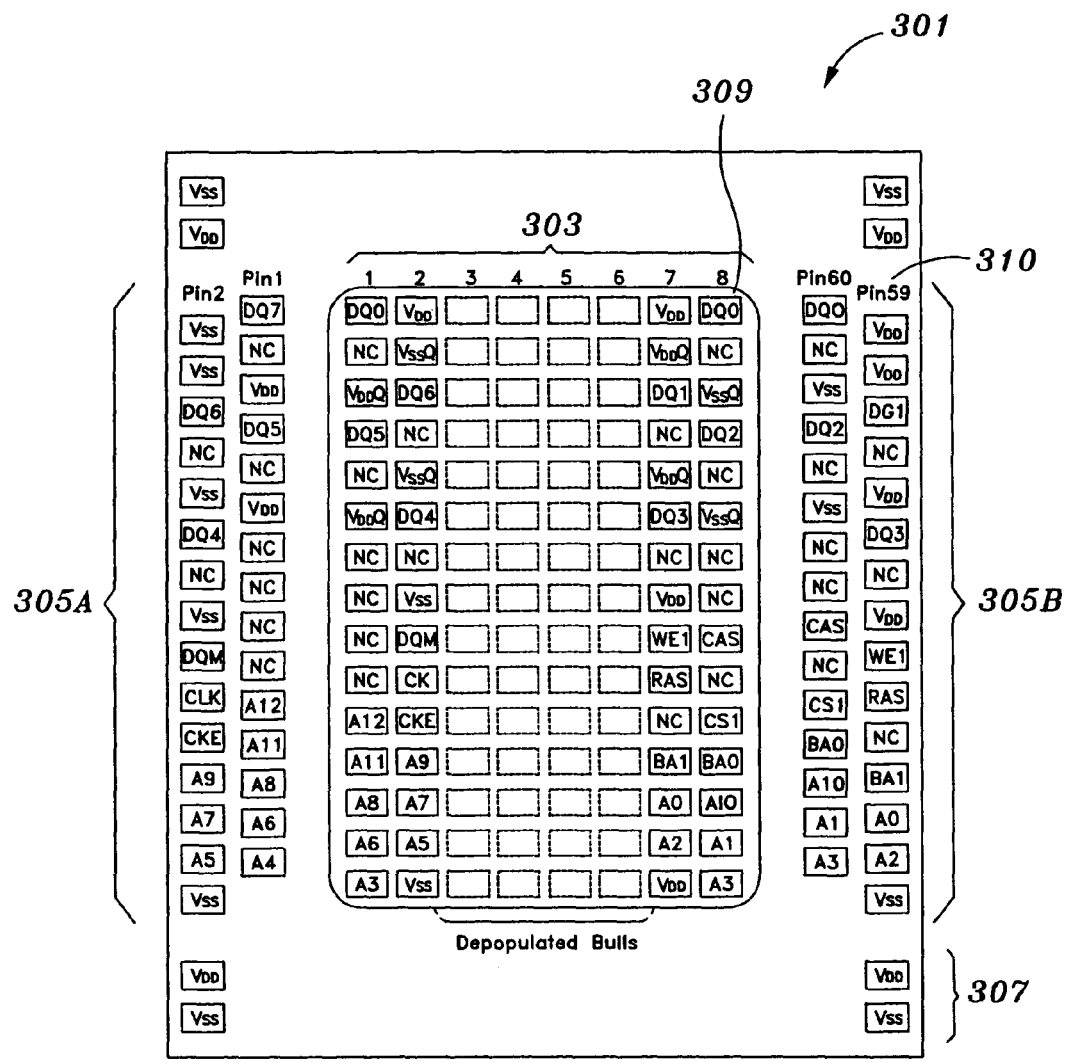
FIG. 18 is a schematic diagram of another type of BGA array with which the present invention can work.

Naturally, the BGA pad arrays 255 on each carrier can be configured in any number of different ways to thereby accept any type of BGA pad array an IC chip might have, be it in the arrays depicted in FIG. 16 or any other configuration such as the matrix type of array depicted in FIG. 18. Since the carrier can be easily wired in a wide variety of ways, the carrier can be designed to work with any standard IC chip package without the need to modify the IC chip package. The carrier of the present invention is truly a modular device. In fact, the carriers provide standard but flexible pin assignments for attaching IC chips to a circuit board.

Also noted above the present invention provides a unique three-dimensional assembly for BGA, CSP, flip chips or and many other types of IC chip packages. The invention also provides for proper capacitive decoupling. Additionally, it provides probe or test points, arrays 257 (79 in some of the FIGS.) for signal sampling, test points for subassembly, etc. Also, it provides close proximity ground points adjacent to the probe points on the top of the carrier, which are available whether or not an IC chip is placed on top of the carrier.

An additional advantage of the present invention is that it can be used in a three-dimensional single sided reflow manufacturing process. The first layer of IC chips can be placed on the circuit board, then the carriers placed over them as appears in FIG. 16 and finally the second set of IC chips can be placed on top of the carriers as depicted in FIG. 17. Once this configuration has been completed the entire board with parts placed on top of the board only has to go through a single reflow process to complete fabrication. Standard manufacturing machinery, such as standard pick and place machines can be used to place all of the IC chips as well as the carriers. As noted above at several places standard unmodified IC chip packages can be used, since the carrier can be tailored to accept any standard IC chip, this could also include those with leads as well as BGA pads, flip chips, CSP etc. Additionally, the carriers could be placed on a strip for the manufacturing process or delivered in standard JEDEC style trays.

FIG. 18 provides a schematic diagram of the pads that would appear on top of the carrier 301 in one preferred embodiment. As can be seen thereon, there is a matrix of pads, 303, for connecting an IC chip to. As depicted therein, there is a solid matrix of eight columns and fifteen rows of pads to receive an IC chip. All of them, or any combination thereof, as is well known in the art, could be used to connect the appropriate IC chip. Additionally, as can be seen on each side, an array of strut pads, 305A, and 305B appear. These, as indicated above, are connected to the IC pad matrix 303, in an appropriate pattern. Additionally, at each corner 307, there are pads for capacitors or other type of appropriate devices. As can be seen, each pin has an appropriate designation, such as Vdd, or DQ2, or NC, etc. For instance, Pad DQ0, in the configuration shown in FIG. 18, is connected to strut via pad 310. As can be seen, the strut pads are designated as various pins in a traditional fashion. by referring to the table in FIG. 19, the connections between the matrix of pads 303, and the pads on each strut, are indicated by the pin conversion table. This is just one example of the possible pad connections that can be made to allow a large variety of different types of chips, with different pad configurations that can be connected with carrier 301.

FIG. 20 provides a schematic diagram of how decoupling capacitors 43 is electrically connected as described above. Capacitor 43 sits on two separate pads (FIG. 1) and each of the pads connect to separate vias one which connects to ground and the other which connects to power. In FIG. 20 decoupling capacitor 43 is placed on pad 41. Pad 41 is connected to via 300 that descends through strut 27 of carrier 21 a corner of which is visible in FIG. 20. Via 300 would than connect to an appropriate pad on a circuit board not shown. Naturally, decoupling capacitor connects two pads is depicted in FIG. 1 and each pad connects by a separate via either to a power or ground connection to thereby become part of the electronic structure of the circuit.

The present invention in another variation allows for the positioning of the decoupling capacitors 303 at a variety of locations on carrier 301 as depicted in FIG. 21. Electrical connection of decoupling capacitors 303 to the system can be accomplished in variety of ways. One variation, depicted in FIG. 21A, a cross-sectional view of carrier 301 along line XX—XX in FIG. 21, depicts how pads 305 and 306 on which decoupling capacitors 303 sit, connect by vias to internal ground 309 and power plane 310 which make up the structure of carrier 301 as described above. Internal power plane 310 connects to at least one via 311 in a strut and internal power plane 309 connects to one via 312 in a strut. Naturally, all connections to internal power plane 310 are electrically isolated from all of the connections to internal power plane 309. In another variation, depicted in FIG. 21B, vias 314 and 315, descending from pads 305 and 306 on which decoupling capacitors 303 sit, connect to conduction lines 317 and 318 that in turn connect directly to vias 320 and 321 in strut 325 which provide power and ground connections.

Figure 22:
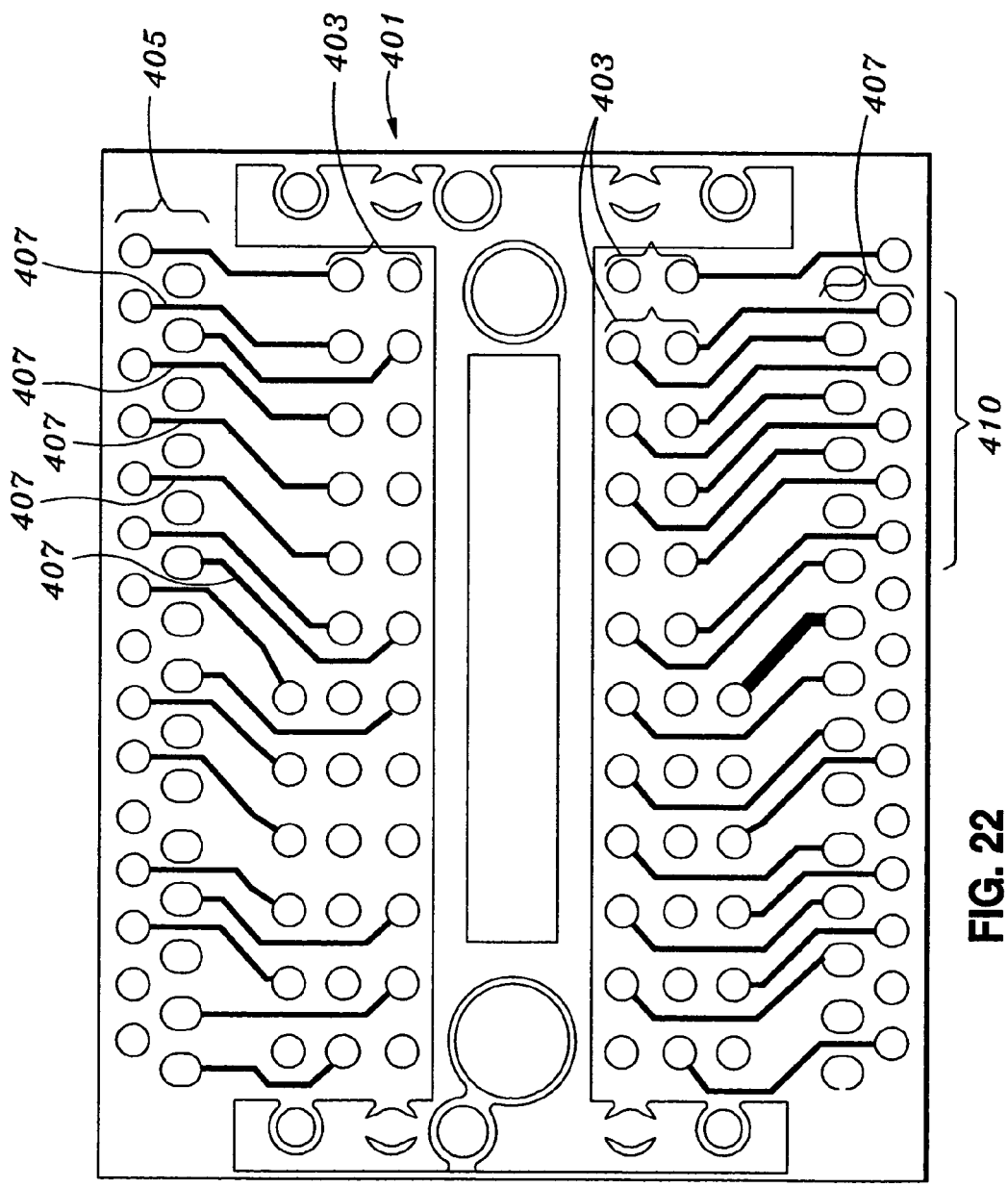
FIG. 22 is a schematic of electrical connections on a substrate layer of the carrier of the present invention.

FIG. 22 provides a schematic of one version of a wiring layout on a wiring substrate layer 401 of the carrier of the present invention. In the wiring layout in FIG. 22, a portion of the Vias 403 that descend from the Pads at the top of the platform to which the IC Chip connection can be seen. Additionally, portions of the Vias 405 in the Struts appear along the edge of the carrier. Additionally conducive paths 407 run between Via portions 403, and the Via portions 405. One of the important operational aspects of any computer system is providing appropriate timing of signal movement. Signals that may be off by a millisecond, or even a picosecond can often create operational problems given the speeds at which computers currently operate. Additionally, the trend is to increase the operational clock times and speed of computers, thus, timing will become even more crucial in the future. One of the advantages of the current invention is that it allows for the arranging of memory or other types of chips in a three-dimensional fashion that allows the reduction of connecting line lengths. This is often crucial in computer architecture and significantly aids in increasing the speed of operation. In fact, during the rapid clock cycles of a computer's operation system, signals have to move in a coordinated fashion and arrive at a specific end point during the clock cycle. If the lines over which signals must move in a coordinated fashion can be the same length for each signal, a significant reduction in problems which arise from coordinating signals can be achieved. Another advantage of the carriers of the present invention is that if several signals must move over adjacent lines at the same time, by matching line lengths on the substrate by staggering the Via locations, the lines can be made exactly the same length. As can be seen in the wiring layout depicted in FIG. 22, some of the conductive lines 407 that run between Viaset 403 to Viaset 405 are of equal length in a number of connections. For instance, all conducive lines labeled 407 in FIG. 22 are of the same Length. Additionally, on the other side of the wiring layout in FIG. 22, the conducive lines running between the Via portions 403 and Via portions 405 are the same length 410. Thus, if a chip placed on the carrier requires a precise parallel transmission of multiple signals simultaneously, the providing of transmission lines on the carrier, of the same Length, significantly reduces possible loss of coordination of the transmission of the parallel signals.

While the invention has been particularly shown and described with reference to a preferred embodiment thereof, it will be understood by those skilled in the art that various changes in form and detail may be made to it without departing from the spirit and scope of the invention.

We claim:

1. A carrier for arranging integrated circuit chips in a three-dimensional array on a circuit board, said carrier comprising:
   a) a platform with a top surface and a bottom surface;
   b) a first strut at a first side of said platform and a second strut at a second side of said platform, said struts providing support for said platform and thereby creating a space below the bottom surface of said platform;
   c) said platform having a pattern of connection pads on its top surface for receiving at least one integrated circuit chip on the top surface on the pattern of connection pads, a bottom side of each pad of said pattern of pads being connected to a via that passes down through said platform to a lower layer in said platform wherein said via connects to a conductive path that extends towards said first or second strut;
   d) said first and second struts having strut vias that extend up through each strut from the bottom of said strut to the top of said strut wherein each of said strut vias connect to a specific conductive path in said platform which specific conductive path connects to a specific via descending from a pad of the pads of the pattern of connection pads;
   e) wherein said carrier forms a modular unit that can accept at least one integrated circuit chip on said pattern of connection pads on the top surface of said platform on said pattern of connection pads and connect that chip to a printed circuit board to which said carrier is attached and provide in the space below the bottom surface of said carrier room for attaching at least a second integrated circuit chip to a circuit board on which said carrier is attached;
   f) wherein said vias are formed by plating an aperture with a conductive material.

2. The carrier of claim 1 wherein said upwardly extending vias comprise a core of electrically conductive material.

3. The carrier of claim 1 wherein said pattern of connection pads of said platform can be varied to form a variety of different array patterns to allow said carrier to accommodate a wide variety of integrated circuit chips, with different array patterns and wherein said conductive paths between said vias of said pads of said connection pads and said vias of said struts can be configured to connect said pattern of connection pads on said platform in a plurality of different configurations to a circuit board.

4. The carrier of claim 1 wherein an integrated circuit chip is adapted to be connected to an array of pads by leads.

5. The carrier of claim 1 wherein hollow spaces left in said apertures after plating said aperture with a conductive material are filled with a pre-selected material to thereby remove said hollow spaces and allow for the positioning of a connection pad on top of said via and thus having to avoid offsetting said pad from said vias.

6. The carrier of claim 5 wherein said pre-selected material is a non-conductive material.

7. The carrier of claim 5 wherein said pre-selected material is a conductive material.

8. The carrier of claim 5 wherein:
a) said top exposed ends of said upwardly extending vias in said first strut are positioned at a top peripheral edge of said first side of said platform in a first predetermined pattern and said top exposed ends of said upwardly extending vias in said second strut are positioned at a top peripheral edge of said second side of said platform in a second predetermined pattern, and
b) an area dimension of said top surface of said platform is such that said top surface of said platform can accommodate at least one integrated circuit chip connected by said pattern of connection pads on said top surface while leaving uncovered and accessible said first predetermined pattern of top exposed ends of said upwardly extending vias and said second predetermined pattern of top exposed ends of said upwardly extending vias.

9. The carrier of claim 1 wherein said first and second strut are a plurality of struts which support said platform.

10. The carrier of claim 1 wherein said pads are directly above said vias.

11. The carrier of claim 1 wherein said pads are offset from said vias.

12. The carrier of claim 1 wherein the connection pads used are selected from the group of BGA pads or Chip scale pads.

13. The carrier of claim 1 wherein said second integrated circuit chip is positioned on a bottom surface of said surface of said platform and connects to a circuit board through vias and conductive lines in said platform and said first and second struts.

14. The carrier of claim 1 further including pads for electrically connecting at least one decoupling capacitor to said carrier.

15. The carrier of claim 14 wherein said pads for said at least one decoupling capacitor connect to either a power or ground layer in said carrier to thereby connect said at least one decoupling capacitor into an electrical circuit.

16. The carrier of claim 14 wherein said pads for said at least one decoupling capacitor connect to vias in a strut and when said carrier is attached to a circuit board said vias connect to power and ground connections on said circuit board to thereby connect said at least one decoupling capacitor into an electrical circuit.

17. The carrier of claim 16 wherein said pads are positioned at a top of said strut.

18. The carrier of claim 1 wherein said carrier is constructed to match the electrical characteristics of a circuit board to which it will be connected.

19. The carrier of claim 1 wherein said carrier is fabricated as a multiple layer board in a fashion similar to a standard circuit board.

20. The carrier of claim 1 wherein said carrier is adapted to be fabricated by an injection molding process.

21. The carrier of claim 1 wherein said vias are adapted to be fabricated by a process selected from a group of a step laminate method or depth routing method.

22. The carrier of claim 1 wherein said second integrated circuit chip connects directly to a circuit board beneath the bottom surface of said platform of said carrier when said carrier is attached to a circuit board.

23. The carrier of claim 1 wherein said vias in said first strut are aligned in a single row along said first strut.

24. The carrier of claim 1 wherein said vias in said second strut are aligned in a single row along said second strut.

25. The carrier of claim 1 wherein said vias in said first strut are aligned in a double row along said first strut.

26. The carrier of claim 1 wherein said vias in said second strut are aligned in a double row along said second strut.

27. The carrier of claim 1 wherein said vias in said first strut are aligned in one or more rows along said first strut.

28. The carrier of claim 1 wherein said vias in said second strut are aligned in one or more rows along said second strut.

29. A carrier for arranging integrated circuit chips in a three-dimensional array on a circuit board, said carrier comprising:
a) a platform with a top surface and a bottom surface;
b) a first strut at a first side of said platform and a second strut at a second side of said platform, said struts providing support for said platform and thereby creating a space below the bottom surface of said platform;
c) said platform having a pattern of connection pads on its top surface for receiving at least one integrated circuit chip on the top surface on the pattern of connection pads, a bottom side of each pad of said pattern of pads being connected to a via that passes down through said platform to a lower layer in said platform wherein said via connects to a conductive path that extends towards said first or second strut;
d) said first and second struts having strut vias that extend up through each strut from the bottom of said strut to the top of said strut wherein each of said strut vias connect to a specific conductive path in said platform which specific conductive path connects to a specific via descending from a pad of the pads of the pattern of connection pads;
e) wherein said carrier forms a modular unit that can accept at least one integrated circuit chip on the top surface of said platform on said pattern of connection pads and connect that chip to a printed circuit board to which said carrier is attached and provide in the space below the bottom surface of said carrier room for attaching at least a second integrated circuit chip to a circuit board on which said carrier is attached;
f) wherein said upwardly extending vias in said first strut extend up to a top edge of said first side of said platform to thereby expose a top surface of said upwardly extending vias on said top surface of said platform and said upwardly extending vias in said second strut extend up to top edge of said second side of said platform to expose a top end of said upwardly extending vias on said top surface of said platform; and
g) wherein said strut vias are formed by plating an aperture with a conductive material.

30. The carrier of claim 29 wherein said upwardly extending vias are adapted to provide heat dissipation.

31. The carrier of claim 29 wherein:
a) said top exposed ends of said upwardly extending vias in said first strut are positioned at a top peripheral edge of said first side of said platform in a first predetermined pattern and said top exposed ends of said upwardly extending vias in said second strut are positioned at a top peripheral edge of said second side of said platform in a second predetermined pattern, b) an area dimension of said top surface of said platform is such that said top surface of said platform can accommodate at least one integrated circuit chip connected by the pattern of connection pads on said top surface while leaving uncovered and accessible said first predetermined pattern of top exposed ends of said upwardly extending vias and said second predetermined pattern of top exposed ends of said upwardly extending vias;

c) wherein said bottom exposed ends of said vias of said first strut are in a predetermined pattern that is a mirror image of said first predetermined pattern and said bottom exposed ends of said vias of said second strut are in a predetermined pattern that is a mirror image of said second predetermined pattern; and d) wherein a second carrier identical to said first carrier in dimensions and arrangement of said predetermined first and second predetermined patterns and said mirror image first and second predetermined patterns can be stacked on said first carrier and said top exposed ends of said vias of said first carrier make electrical contact with said bottom exposed ends of said second carrier.

32. The carrier of claim 31 wherein at least one integrated circuit chip can be connected to said board in the space below the bottom surface of said first carrier, at least one integrated circuit chip can be connected to said top surface of said platform on said first carrier and at least one integrated circuit chip can be connected to said top surface of said platform of said second carrier and all of said integrated circuit chips can be electrically connected to circuitry in said board.

33. The carrier of claim 32 wherein said pattern of connection pads on said platforms of both carriers can be varied to allow said carriers to accommodate a wide variety of integrated circuit chips with different patterns of connection pads, and wherein said conductive paths between said vias of said pads of said connection pads and said vias of said struts can be configured to connect said pads on said platform in a plurality of different configurations to a circuit board.

34. The carrier of claim 32 wherein said exposed top ends of said upwardly extending vias in said struts of said second carrier provide contact points for testing said first and second carriers and any attached integrated circuit chips while said first and second carriers and any attached integrated circuit chips are connected in a circuit.

35. The carrier of claim 31 wherein a plurality of like carriers can be placed one on the other to form a three dimensional array of carriers electrically connected to each other.

36. The carrier of claim 35 wherein said pattern of connection pad arrays on said platforms of said plurality of carriers can be varied to allow said carriers to accommodate a wide variety of integrated circuit chip pad array patterns and wherein said conductive paths between said vias of said pads of said connection pad array and said vias of said struts can be configured to connect said pads on said platform in a plurality of different configurations to said vias in said first and second struts.

37. The carrier of claim 35 wherein said exposed top ends of said upwardly extending vias in said struts of a top most carrier provide contact points for testing said plurality of stacked carriers and any attached integrated circuit chips while said plurality of stacked carriers and any attached integrated circuit chips are connected in a circuit.

38. The carrier of claim 31 wherein said exposed top ends of said upwardly extending vias in said struts of a said second carrier provide contact points for testing said first and second carriers and any attached integrated circuit chips while the same are connected to the board.

39. The carrier of claim 29 wherein said exposed top ends of said strut vias provide test points to test said carrier connections while said carrier is connected to a circuit.

40. The carrier of claim 29 wherein hollow spaces left in said apertures after plating said aperture with a conductive material are filled with a pre-selected material to thereby remove said hollow spaces and allow for the positioning of a connection pad on top of said via and thus avoiding having to offset said pad from said vias.

41. The carrier of claim 40 wherein said pre-selected material is a non-conductive material.

42. The carrier of claim 40 wherein said pre-selected material is a conductive material.

43. The carrier of claim 29 where:
a) said top exposed ends of said upwardly extending vias in said first strut are positioned at a top peripheral edge of said first side of said platform in a first predetermined pattern and said top exposed ends of said upwardly extending vias in said second strut are positioned at a top peripheral edge of said second side of said platform in a second predetermined pattern, and
b) an area dimension of said top surface of said platform is such that said top surface of said platform can accommodate at least one integrated circuit chip connected by said pattern of connection pads on said top surface while leaving uncovered and accessible said first predetermined pattern of top exposed ends of said upwardly extending vias and said second predetermined pattern of top exposed ends of said upwardly extending vias.

44. The carrier of claim 29 wherein said pads are directly above said vias.

45. The carrier of claim 29 wherein said pads are offset from said vias.

46. The carrier of claim 29 wherein said top exposed ends of vias in said struts provide points to conduct signal analysis of said carrier when connected to a circuit board with at least one integrated circuit chip connected to said carrier.

47. The carrier of claim 29 wherein said top exposed ends of said vias in said struts are used for testing or signal analysis and wherein at least one ground point is adjacent to said top exposed ends of said vias in said struts facilitating the signal analysis or testing.

48. The carrier of claim 47 wherein said at least one ground point is selected from a group of a special ground area adjacent to said top exposed ends of said vias in said strut or at least one of said top exposed ends of said vias is a ground point.

49. The carrier of claim 48 wherein said signal analysis or testing is conducted by probe points.

50. The carrier of claim 29 wherein said vias in said first strut are aligned in a single row along said first strut.

51. The carrier of claim 29 wherein said vias in said second strut are aligned in a single row along said second strut.

52. The carrier of claim 29 wherein said vias in said first strut are aligned in a double row along said first strut.

53. The carrier of claim 29 wherein said vias in said second strut are aligned in a double row along said second strut.

54. The carrier of claim 29 wherein said vias in said first strut are aligned in one or more rows along said first strut.

55. The carrier of claim 29 wherein said vias in said second strut are aligned in one or more rows along said second strut.

56. A carrier for arranging integrated circuit chips in a three-dimensional array on a circuit board, said carrier comprising:
   a) a platform with a top surface and a bottom surface;
   b) a first strut at a first side of said platform and a second strut at a second side of said platform, said struts providing support for said platform and thereby creating a space below the bottom surface of said platform;
   c) said platform having a pattern of connection pads on its top surface for receiving at least one integrated circuit chip on the top surface on the pattern of connection pads, a bottom side of each pad of said pattern of pads being connected to a via that passes down through said platform to a lower layer in said platform wherein said via connects to a conductive path that extends towards said first or second strut;
   d) said first and second struts having strut vias that extend up through each strut from the bottom of said strut to the top of said strut wherein each of said strut vias connect to a specific conductive path in said platform which specific conductive path connects to a specific via descending from a pad of the pads of the pattern of connection pads;
   e) wherein said carrier forms a modular unit that can accept at least one integrated circuit chip on the top surface of said platform on said pattern of connection pads and connect that chip to a printed circuit board to which said carrier is attached and provide in the space below the bottom surface of said carrier room for attaching at least a second integrated circuit chip to a circuit board on which said carrier is attached;
   f) further including pads for electrically connecting at least one decoupling capacitor to said carrier;
   g) wherein said pads for said at least one decoupling capacitor connects to vias in a strut and when said carrier is attached to a circuit board said vias connect to power and ground connections on said circuit board to thereby connect said at least one decoupling capacitor into an electrical circuit; and
   h) wherein said pads for the at least one decoupling capacitor connect to said vias in said struts by secondary vias that connect to conductive paths which in turn connect to said vias in said strut.

57. The carrier of claim 56 wherein said vias in said first strut are aligned in a single row along said first strut.

58. The carrier of claim 56 wherein said vias in said second strut are aligned in a single row along said second strut.

59. The carrier of claim 56 wherein said vias in said first strut are aligned in a double row along said first strut.

60. The carrier of claim 56 wherein said vias in said second strut are aligned in a double row along said second strut.

61. The carrier of claim 56 wherein said vias in said first strut are aligned in one or more rows along said first strut.

62. The carrier of claim 56 wherein said vias in said second strut are aligned in one or more rows along said second strut.

63. A method for arranging integrated circuit chips on a circuit board in a three-dimensional array, said method comprising the steps of:
   a) providing a platform for receiving a first integrated circuit chip;
   b) providing at least one support strut to support said platform and thereby form a carrier;
   c) connecting electronically said chip through the platform and the strut to a circuit board when the carrier is connected to a circuit board;
   d) forming the at least one strut and platform in a configuration that allows for space beneath a bottom portion of the platform so that when the carrier is attached to a circuit board there is space beneath the platform for connecting a second integrated circuit chip to a circuit board;
   e) providing test contacts on the carrier that are accessible when the carrier is attached to the board and an integrated circuit chip is connected to the top of the platform;
   f) wherein the step of connecting an integrated circuit chip electronically to a board to which the carrier might be attached includes the steps of: providing electronically conductive vias which extend down from connection pads on the top of the platform to a connection layer in the carrier; connecting the via to electrically conductive lines in the connection layer; running the electrically conductive lines to the at least one strut; providing the electrically conductive vias in the at least one strut to which to connect the electrically conductive lines in a pre-selected pattern; having the electrically conductive vias in the at least one strut descend from the point where they connect to the electrically conductive lines to a bottom of the at least one strut; and terminating the electrically conductive vias at the bottom of the at least one strut at connection pads that allow for connection of the carrier to a circuit board;
   g) wherein the steps of providing vias descending from the platform, and vias in the at least one strut, include the steps of providing apertures in the platform or strut; and depositing in the apertures an electrically conductive material; and
   h) including the further step of depositing additional fill material into hollow spaces left by the step of depositing electrically conductive material in the apertures.

64. The method of claim 63 wherein the step of depositing additional fill material comprises depositing non-conductive fill material.

65. The method of claim 63 wherein the step of depositing additional fill material comprises depositing conductive fill material.

66. The method of claim 63 wherein the step of providing test contact points on the carrier accessible when the carrier is attached to a circuit board and a first integrated circuit chip is connected to the platform includes the step of providing at the top of the at least one strut exposed top ends of the vias.

67. The carrier of claim 63 wherein said vias in said first strut are aligned in a single row along said first strut.

68. The carrier of claim 63 wherein said vias in said second strut are aligned in a single row along said second strut.

69. The carrier of claim 63 wherein said vias in said first strut are aligned in a double row along said first strut.

70. The carrier of claim 63 wherein said vias in said second strut are aligned in a double row along said second strut.

71. The carrier of claim 63 wherein said vias in said first strut are aligned in one or more rows along said first strut.

72. The carrier of claim 63 wherein said vias in said second strut are aligned in one or more rows along said second strut.

73. A carrier for arranging integrated circuit chips in a three-dimensional array on a circuit board, said carrier comprising:
  a) means for providing a platform for receiving a first integrated circuit chip;
  b) means for supporting said platform to thereby form a carrier with a space beneath said carrier to thereby provide room for connection of a second integrated circuit chip to a circuit board when said carrier is attached to a circuit board;
  c) means for electrically connecting, through said means for supporting said platform, a first integrated circuit chip that is connected to the a top surface of said platform of said carrier to a circuit board when said carrier is connected to a board;
  d) wherein the means for electrically connecting, through said means for supporting said platform, a first integrated circuit chip that is connected to a top of said platform of said carrier to a circuit board when the said carrier is connected to a board comprises:
    i) electrically conductive vias which extend down from connection pads on the top of the platform to a connection layer in said carrier;
    ii) conductive lines in said connection layer connect to the conductive vias which extend down from the connection pads;
    iii) wherein the support means is at least one strut and the electrically conductive lines run to the at least one strut;
    iv) conductive vias in the at least one strut to which to connect the electrically conductive lines in a preselected pattern; and
    v) wherein the electrically conductive vias in the at least one strut descend from the point where they connect to the electrically conductive lines to a bottom of the at least one strut; and terminate at a bottom of the at least one strut at connection pads that allow for connection of the carrier to a circuit board; and
  e) wherein the electrically conductive vias in the platform and the at least one strut are formed by apertures into which an electrically conductive material is deposited; and
  f) wherein the apertures include fill material deposited into hollow spaces left after said electrically conductive material is deposited into the apertures to thereby provide support for a pad placed on a top exposed end of the via.

74. The carrier of claim 73 wherein the fill material is non-conductive fill material.

75. The carrier of claim 73 wherein the fill material is a conductive fill material.

76. The carrier of claim 73 wherein the test contacts on the carrier, accessible when the carrier is attached to a circuit board and a first integrated circuit chip is connected to the platform, are formed by providing at the top of the at least one strut exposed top ends of the vias.

77. The carrier of claim 76 wherein the at least one strut is two struts.

78. The carrier of claim 73 wherein said vias in said first strut are aligned in a single row along said first strut.

79. The carrier of claim 73 wherein said vias in said second strut are aligned in a single row along said second strut.

80. The carrier of claim 73 wherein said vias in said first strut are aligned in a double row along said first strut.

81. The carrier of claim 73 wherein said vias in said second strut are aligned in a double row along said second strut.

82. The carrier of claim 73 wherein said vias in said first strut are aligned in one or more rows along said first strut.

83. The carrier of claim 73 wherein said vias in said second strut are aligned in one or more rows along said second strut.

84. A carrier for arranging integrated circuit chips on a circuit board in a three-dimensional array, said carrier comprising:
  a) a platform for receiving a first integrated circuit chip;
  b) at least one strut for supporting said platform to thereby form a carrier with a space beneath said carrier to thereby provide room for connection of a second integrated circuit chip to a circuit board when said carrier is attached to a circuit board;
  c) an electrically connecting path from connection pads on a top of said platform for receiving and connecting a first integrated circuit chip, through said platform, and said at least one strut to connection points at a bottom of said one strut when said carrier is connected to a circuit board;
  d) further including pads for electrically connecting at least one decoupling capacitor to said carrier;
  e) wherein said pads for said at least one decoupling capacitor connect to vias in a strut and when said carrier is attached to a circuit board said vias connect to power and ground connections on said circuit board to thereby connect said at least one decoupling capacitor into an electrical circuit; and
  f) wherein said pads for the at least one decoupling capacitor connect to said vias in said struts by secondary vias that connect to conductive paths which in turn connect to said vias in said strut.

85. The carrier of claim 84 wherein said vias in said first strut are aligned in a single row along said first strut.

86. The carrier of claim 84 wherein said vias in said second strut are aligned in a single row along said second strut.

87. The carrier of claim 84 wherein said vias in said first strut are aligned in a double row along said first strut.

88. The carrier of claim 84 wherein said vias in said second strut are aligned in a double row along said second strut.

89. The carrier of claim 84 wherein said vias in said first strut are aligned in one or more rows along said first strut.

90. The carrier of claim 84 wherein said vias in said second strut are aligned in one or more rows along said second strut.

* * * * *